US006168704B1

(12) United States Patent
Brown et al.

(10) Patent No.: US 6,168,704 B1
(45) Date of Patent: Jan. 2, 2001

(54) SITE-SELECTIVE ELECTROCHEMICAL DEPOSITION OF COPPER

(75) Inventors: Thomas M. Brown; Stephen W. Hymes, both of Austin, TX (US)

(73) Assignee: Advanced Micro Device, Inc., Austin, TX (US)

( * ) Notice: Under 35 U.S.C. 154(b), the term of this patent shall be extended for 0 days.

(21) Appl. No.: 09/244,469

(22) Filed: Feb. 4, 1999

(51) Int. Cl.[7] ................................ C25D 5/02; C25D 5/10

(52) U.S. Cl. ........................... 205/118; 205/125; 205/182

(58) Field of Search .................................... 205/118, 125, 205/135, 170, 182

(56) References Cited

U.S. PATENT DOCUMENTS 4,988,412 * 1/1991 Liu et al. ............................... 204/15
5,086,017 * 2/1992 Lu ........................................ 437/200
5,098,860 * 3/1992 Chakravorty et al. ............... 437/195
5,151,168 * 9/1992 Gilton et al. ......................... 205/123
5,744,376 * 4/1998 Chan et al. .......................... 437/190
5,900,672 * 5/1999 Chan et al. .......................... 257/751
5,912,508 * 6/1999 Iacoponi ............................... 257/770
5,968,333 * 10/1999 Nogami et al. ...................... 205/184

* cited by examiner

*Primary Examiner*—Kathryn Gorgos
*Assistant Examiner*—Erica Smith-Hicks
(74) *Attorney, Agent, or Firm*—Williams, Morgan & Amerson

(57) ABSTRACT

A method is provided for selectively electrochemically depositing copper. The method includes forming a layer of dielectric material above a structure layer, forming a conductive layer above the layer of dielectric material and forming an opening in the conductive layer and the layer of dielectric material. The method also includes selectively forming at least one barrier metal layer and a copper seed layer only in the opening, the at least one barrier metal layer and the copper seed layer being conductively coupled to the conductive layer. The method further includes forming an insulating layer above the conductive layer, and selectively electrochemically depositing copper only in the opening.

74 Claims, 26 Drawing Sheets

SITE-SELECTIVE ELECTROCHEMICAL DEPOSITION OF COPPER

BACKGROUND OF THE INVENTION

1. Field of the Invention

This invention relates generally to semiconductor fabrication technology and, more particularly, to electrochemical deposition processes for filling contact openings and vias and creating interconnect lines with metal.

2. Description of the Related Art

The ideal interconnect conductor for semiconductor circuitry will be inexpensive, easily patterned, have low resistivity, and high resistance to corrosion, electromigration, and stress migration. Aluminum is most often used for interconnects in contemporary semiconductor fabrication processes primarily because it is inexpensive and easier to etch than, for example, copper. However, because aluminum has poor electromigration characteristics and high susceptibility to stress migration, it is typically necessary to alloy aluminum with other metals.

As semiconductor device geometries shrink and clock speeds increase, it becomes increasingly desirable to reduce the resistance of the circuit metallization. The one criterion that is most seriously compromised by the use of aluminum for interconnects is that of conductivity. This is because the three metals with lower resistivities (aluminum has a resistivity of $2.824\times10^{-6}$ ohms-cm at 20° C.), namely, silver with a resistivity of $1.59\times10^{-6}$ ohms-cm (at 20° C.), copper with a resistivity of $1.73\times10^{-6}$ ohms-cm (at 20° C.), and gold with a resistivity of $2.44\times10^{-6}$ ohms-cm (at 20° C.), fall short in other important criteria. Silver, for example, is relatively expensive and corrodes easily, and gold is very costly and difficult to etch. Copper, with a resistivity nearly on par with silver, immunity from electromigration, high ductility (which provides high immunity to mechanical stresses generated by differential expansion rates of dissimilar materials in a semiconductor chip) and high melting point (1083° C. vs. 659° C. for aluminum), fills most criteria admirably. However, copper is exceedingly difficult to etch in a semiconductor environment. As a result of the difficulty in etching copper, an alternative approach to forming vias and metal lines must be used. The damascene approach, consisting of etching openings such as trenches in the dielectric for lines and vias and creating in-laid metal patterns, is the leading contender for fabrication of sub-0.25 micron (sub-0.25 $\mu$) design rule copper-metallized circuits.

In a typical single-damascene copper process flow, as shown in FIGS. 1A–1E, a first dielectric layer 100 is deposited on a second dielectric layer 105 on a wafer 107. The second dielectric layer 105 has an intermetal via connection 110 disposed therein. If necessary, the first dielectric layer 100 is planarized using chemical-mechanical planarization (CMP). A metallization pattern is then formed by using a patterned photomask 115 (FIG. 1A) and photolithography. For example, openings (such as trench 120) for conductive metal lines, contact holes, via holes, and the like, are etched into the first dielectric layer 100 (FIG. 1B). The patterned photomask 115 is then stripped and a thin barrier metal layer of tantalum 125A and a copper seed layer 125B are then applied to the entire surface using vapor-phase deposition (FIG. 1C). The barrier metal layer of tantalum 125A and the copper seed layer 125B blanket-deposit the entire upper surface 130 of the first dielectric layer 100 as well as the side and bottom surfaces of the trench 120, forming a conductive surface 135, as shown in FIG. 1C.

The bulk of the copper trench-fill is frequently done using an electroplating technique, where the conductive surface 135 is mechanically clamped to an electrode to establish an electrical contact, and the wafer 107 is then immersed in an electrolyte solution containing copper ions. An electrical current is then passed through the wafer-electrolyte system to cause reduction and deposition of copper on the conductive surface 135. In addition, an alternating-current bias of the wafer-electrolyte system has been considered as a method of self-planarizing the deposited copper film, similar to the deposit-etch cycling used in high-density plasma (HDP) tetraethyl orthosilicate (TEOS) dielectric depositions.

This process typically produces a conformal coating 140 of constant thickness across the entire conductive surface 135, as shown in FIG. 1D. Once a sufficiently thick layer of copper 140 has been deposited, the surface of the wafer is planarized using CMP techniques. Ideally, this clears all copper and tantalum barrier metal from the entire upper surface 130 of the first dielectric layer 100, leaving copper only in the copper-filled trenches (such as copper-filled trench 145), as shown in FIG. 1E.

In a typical dual-damascene copper process flow, as shown in FIGS. 2A–2E, a first dielectric layer 200 is deposited on a second dielectric layer 205 on a wafer 207. The second dielectric layer 205 has a "hard mask" (typically silicon nitride, SiN) 210 deposited and patterned thereon, between the first dielectric layer 200 and the second dielectric layer 205. If necessary, the first dielectric layer 200 is planarized using CMP. Metallization patterns are then applied using the hard mask 210 and a patterned photomask 215 (FIG. 2A) and photolithography. Openings (such as trenches 220 and 225) for conductive metal lines, contact holes, via holes, and the like, are etched into both the first dielectric layer 200 and the second dielectric layer 205. The patterned photomask 215 is then stripped (FIG. 2B) and a thin barrier metal layer of tantalum 230A and a copper seed layer 230B are then applied to the entire surface using vapor-phase deposition. The barrier metal layer of tantalum 230A and the copper seed layer 230B blanket-deposit the entire upper surface 235 of the first dielectric layer 200 as well as the side and bottom surfaces of the trenches 220 and 225, forming a conductive surface 240, as shown in FIG. 2C.

The bulk of the copper trench-fill is again done using an electroplating technique, where the conductive surface 240 is mechanically clamped to an electrode to establish an electrical contact, and the wafer 207 is then immersed in an electrolyte solution containing copper ions. An electrical current is then passed through the wafer-electrolyte system to cause reduction and deposition of copper on the conductive surface 240.

This process typically produces a conformal coating 245 of constant thickness across the entire conductive surface 240, as shown in FIG. 2D. Once a sufficiently thick layer of copper 245 has been deposited, the surface of the wafer is planarized using CMP techniques. Ideally, this clears all copper and tantalum barrier metal from the entire upper surface 235 of the first dielectric layer 200, leaving copper only in the copper-filled trenches (such as copper-filled trenches 250 and 255), as shown in FIG. 2E.

The dual-damascene copper process flow, as shown in FIGS. 2A–2E, combines the intermetal via connection formation with the copper trench-fill deposition by etching a more complex pattern before the barrier metal layer and copper seed layer depositions and before the copper trench-fill. The trench etching continues until the via hole (such as trench 225 in FIG. 2B) has been etched out. The rest of the dual-damascene copper process flow, as shown in FIGS.

2C–2E, is essentially identical with the corresponding single-damascene copper process flow, as shown in FIG. 1C–1E. Overall, however, the dual-damascene copper process flow significantly reduces the number of processing steps and is typically a preferred method of achieving copper metallization.

Nevertheless, both the dual-damascene copper process flow, as shown in FIGS. 2A–2E, and the single-damascene copper process flow, as shown in FIGS. 1A–1E, entail electroplating a copper layer across the entire conductive surface. This increases the cost of the raw materials and the amount of processing needed to remove the copper from undesired areas when compared to a method that enables a copper layer to be selectively deposited only to desired areas. Selective copper deposition methods lower manufacturing costs by increasing throughput, reducing consumption of electroplating solution and CMP consumables, reducing the amount of post-metallization-deposition CMP needed and reducing the amount of hazardous effluents.

Processes are known for metallizing semiconductor circuitry with copper through selective electrodeposition, as described, for example, in U.S. Pat. No. 5,151,168, entitled "Process for Metallizing Integrated Circuits with Electrolytically-Deposited Copper," to Gilton et al., and as shown in FIGS. 3A–3E. Referring now to FIG. 3A, a portion of a semiconductor wafer containing in-process integrated circuit chips is shown at the stage where a dielectric layer 300 overlying a silicon substrate 305 has been patterned and etched in order to create contact openings 310 through dielectric layer 300 to junction regions 315 within the substrate 305.

Referring now to FIG. 3B, a thin conductive barrier layer 320 of titanium nitride or titanium-tungsten or nitrided titanium-tungsten is blanket-deposited over the surface of the entire wafer. Barrier layer 320 functions both as a diffusion barrier to prevent spiking (contamination) of junctions 315 by a metallization layer that will be electroplated on top of barrier layer 320, and as the initial conductive surface for the electrodeposition process. However, the conductive properties of barrier layer 320 are limiting when the barrier layer 320 is used as a conductive coupling between contact openings 310, and this is problematic.

Barrier layer 320 may be deposited using one of several available techniques, including sputtering or LPCVD, with LPCVD being a preferred method because it produces layers having greater conformality. The barrier layer 320 thickness is typically approximately 200Å to 300Å.

Referring now to FIG. 3C, a cross-sectional view of the in-process wafer portion of FIG. 3B, following the creation of a dielectric material mask 325 on top of barrier layer 320, the dielectric material mask 325 having the reverse image of the desired interconnect pattern. Dielectric material mask 325 may be created either out of photoresist directly or by etching a layer of a material such as silicon dioxide or silicon nitride, using photoresist as a template. If photoresist is utilized for the mask, for optimum copper electrodeposition performance, it is typically toughened by subjecting it to ultraviolet radiation during a high-temperature post-baking operation. However, because there is the formation of a dielectric material mask 325 after contact openings 310 have been etched, the dielectric material mask 325 is difficult to remove from contact openings 310, particularly from deep openings, and this is problematic.

Referring now to FIG. 3D, the wafer is then transferred to an electrolytic bath, maintained at a constant temperature of approximately 25° C., in which copper is complexed with ethylenediaminetetraacetic acid (EDTA) molecules in a basic solution. Such a bath is normally utilized for galvanic, not electrolytic, deposition. Copper sulfate ($CuSO_4$) in a concentration of 0.035 molar provides the copper ions for the reaction (a usefull range is typically between 0.01 and 0.07 molar). Additionally, a $Na_4$EDTA concentration of 0.070 molar is used (a useful range is typically between 0.02 and 0.14 molar). A pH level of approximately 13.5 is preferred, although metallic copper will adhere to the barrier layer and achieve excellent step coverage with a pH range of roughly 6.0 to 13.5. For pH values above 10, photoresist dielectric material masks typically are stabilized with UV radiation during a post-baking step. At the lower pH values, though, the copper metal is much more coarsely grained. Sodium hydroxide or potassium hydroxide is utilized to adjust the pH level. Metallic copper 330 is deposited on those portions of barrier layer 320 where it is not covered by dielectric material mask 325. At current densities of less than 1 milliamp/cm$^2$, the process will automatically fill contact/via openings 310 to a uniform thickness that is independent of the depth of contact/via openings 310.

Referring now to FIG. 3E, following electrodeposition of the copper metallization layer 330 to the desired thickness, the wafer is removed from the electroplating bath, rinsed, dried, and dielectric material mask 325 is then stripped.

The present invention is directed to overcoming, or at least reducing the effects of, one or more of the problems set forth above.

SUMMARY OF THE INVENTION

In one aspect of the present invention, a method is provided for selectively electrochemically depositing copper. The method includes forming a layer of dielectric material above a structure layer, forming a conductive layer above the layer of dielectric material and forming an opening in the conductive layer and the layer of dielectric material. The method also includes selectively forming at least one barrier metal layer and a copper seed layer only in the opening, the at least one barrier metal layer and the copper seed layer being conductively coupled to the conductive layer. The method further includes forming an insulating layer above the conductive layer, and selectively electrochemically depositing copper only in the opening.

In a method according to the present invention, there is no formation or deposition of a photoresist or masking material after openings have been formed or etched. Such photoresist and/or masking materials are difficult to remove from openings, particularly from deep openings. In a method according to the present invention, because the barrier metal and copper seed layers selectively formed only in the openings are conductively coupled to a conductive layer, the conductive properties of the barrier metal and copper seed layers between the openings are not limiting. In a method according to the present invention, no etching of the barrier metal and copper seed layers is needed.

BRIEF DESCRIPTION OF THE DRAWINGS

The invention may be best understood by reference to the following description taken in conjunction with the accompanying drawings, in which the leftmost significant digit(s) in the reference numerals denote(s) the first figure in which the respective reference numerals appear, and in which.

Figure 1A:
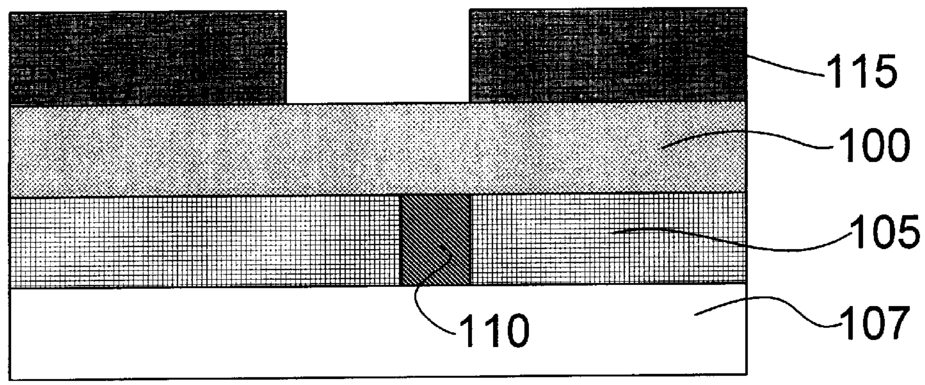
FIGS. 1A–1E show a conventional single-damascene copper process flow.
Figure 1B:
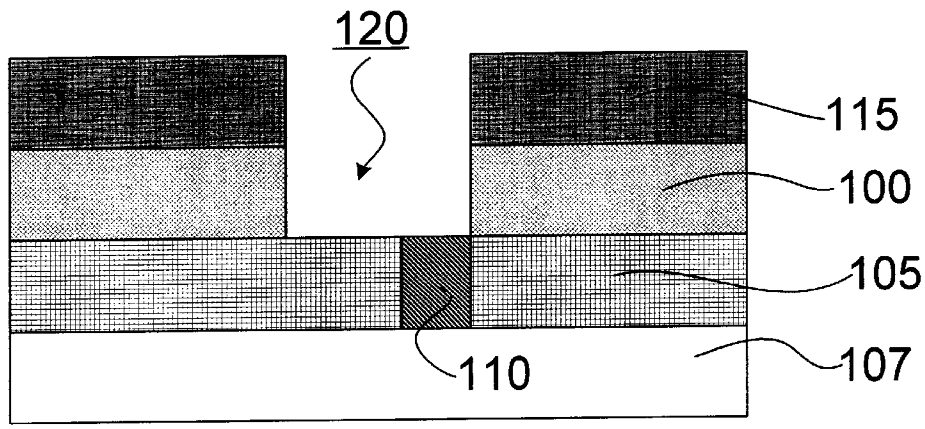
Figure 1C:
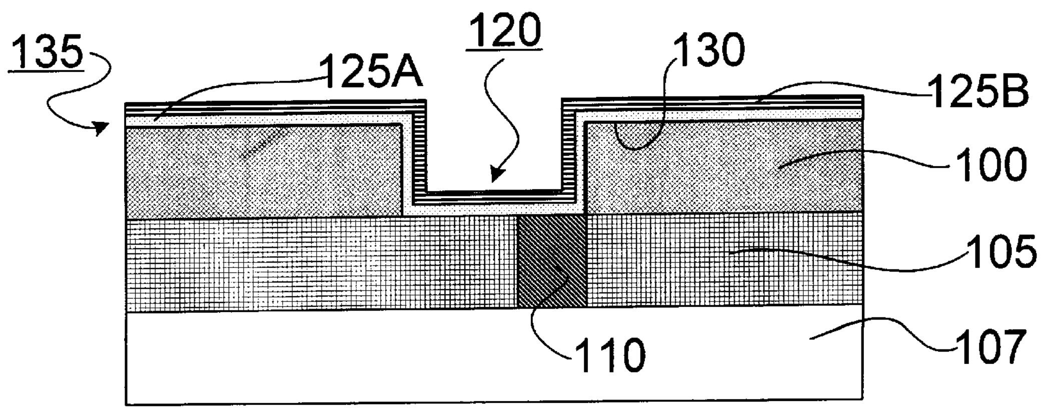
Figure 1D:
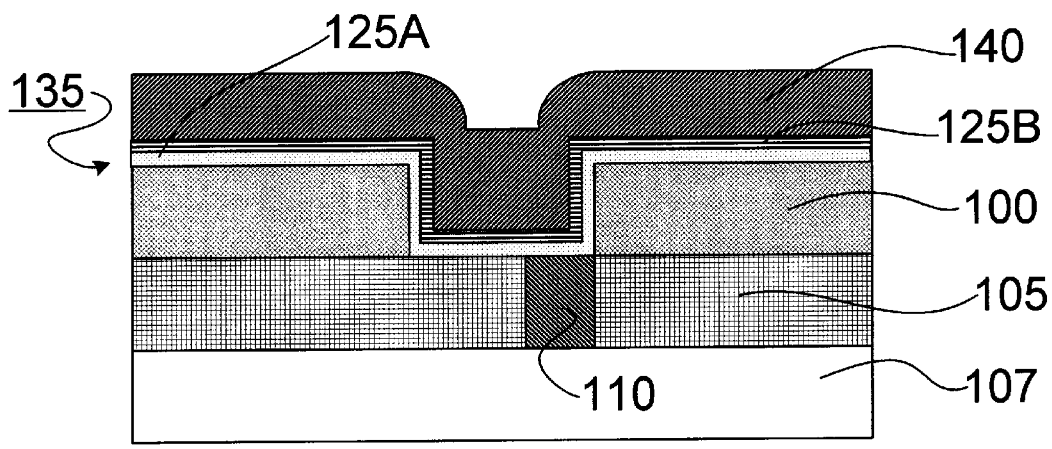
Figure 1E:
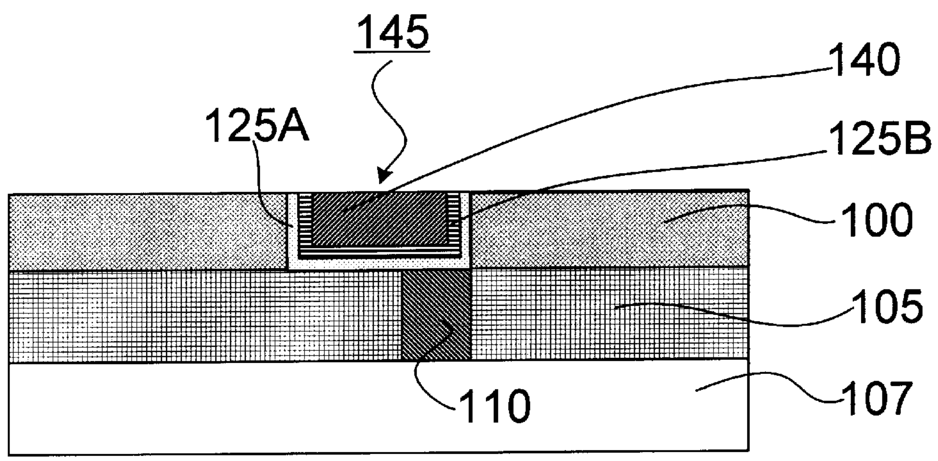
Figure 2A:
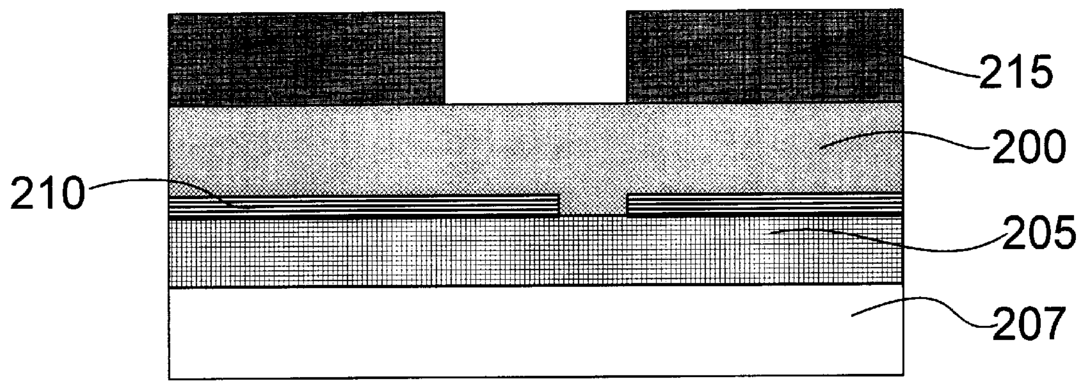
FIGS. 2A–2E show a conventional dual-damascene copper process flow.
Figure 2B:
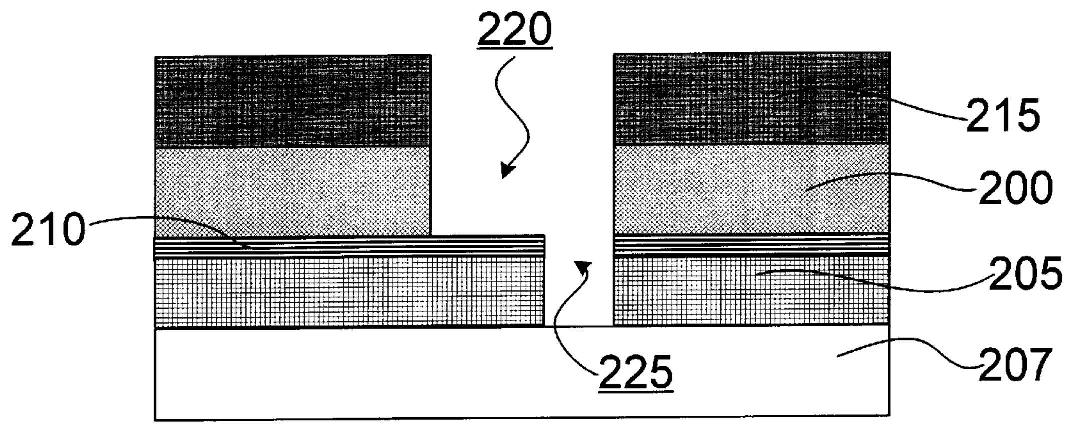
Figure 2C:
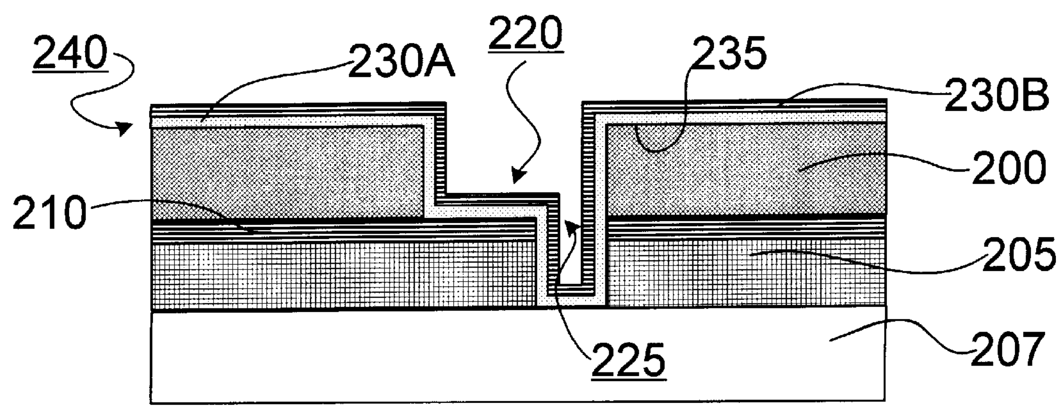
Figure 2D:
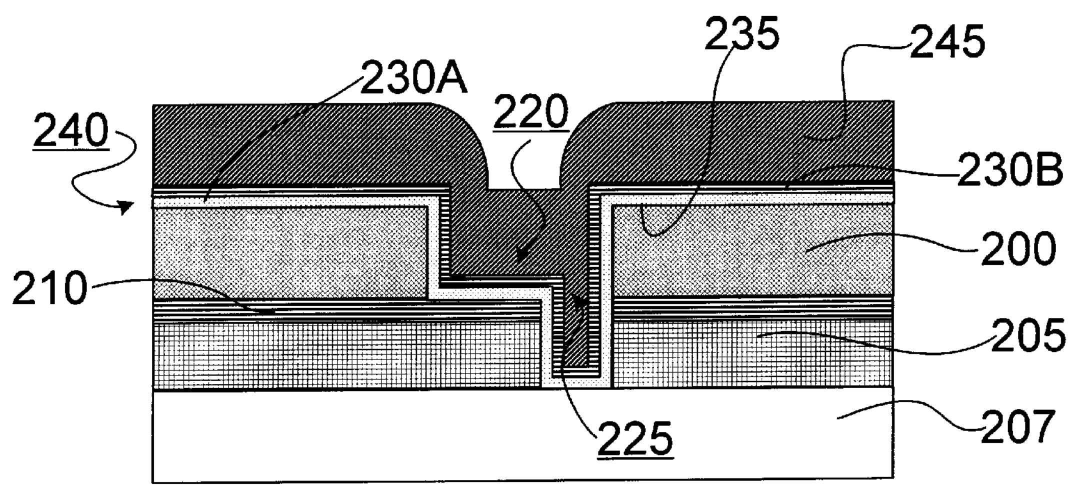
Figure 2E:
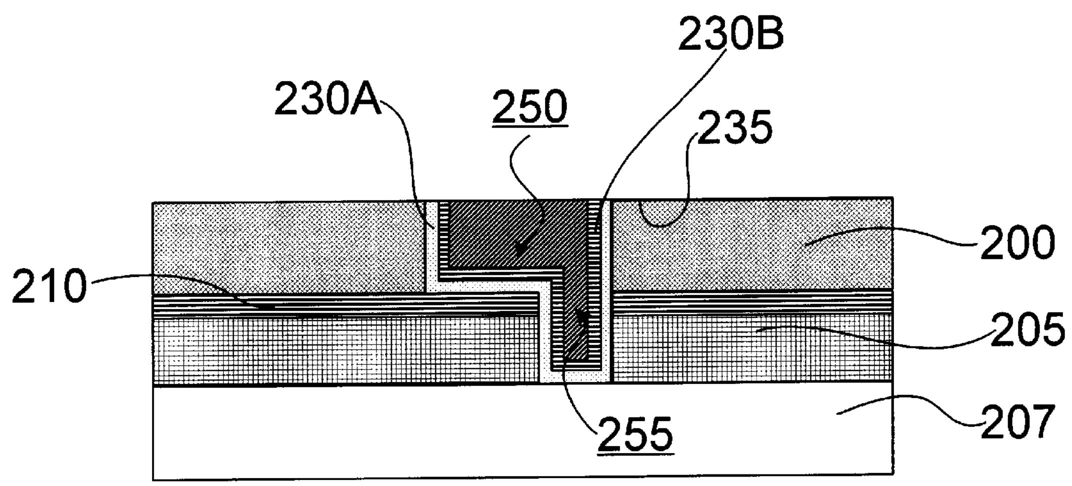
Figure 3A:
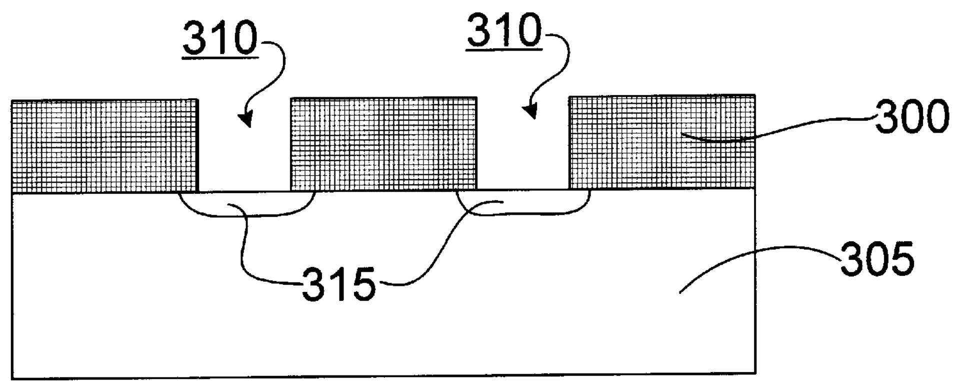
FIGS. 3A–3E show a conventional selective copper electrodeposition process flow.
Figure 3B:
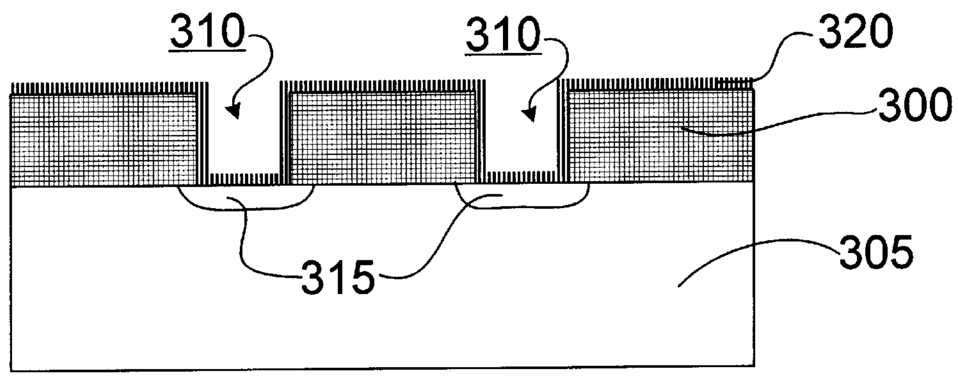
Figure 3C:
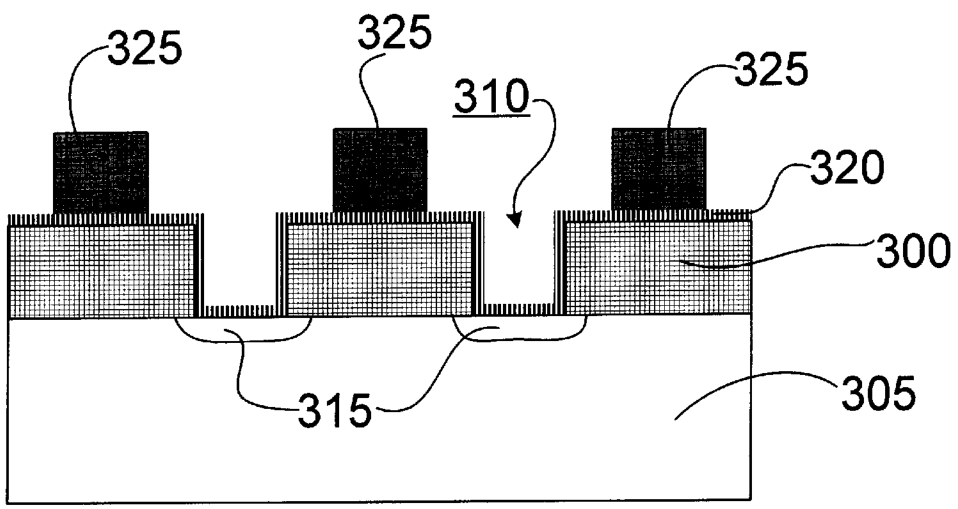
Figure 3D:
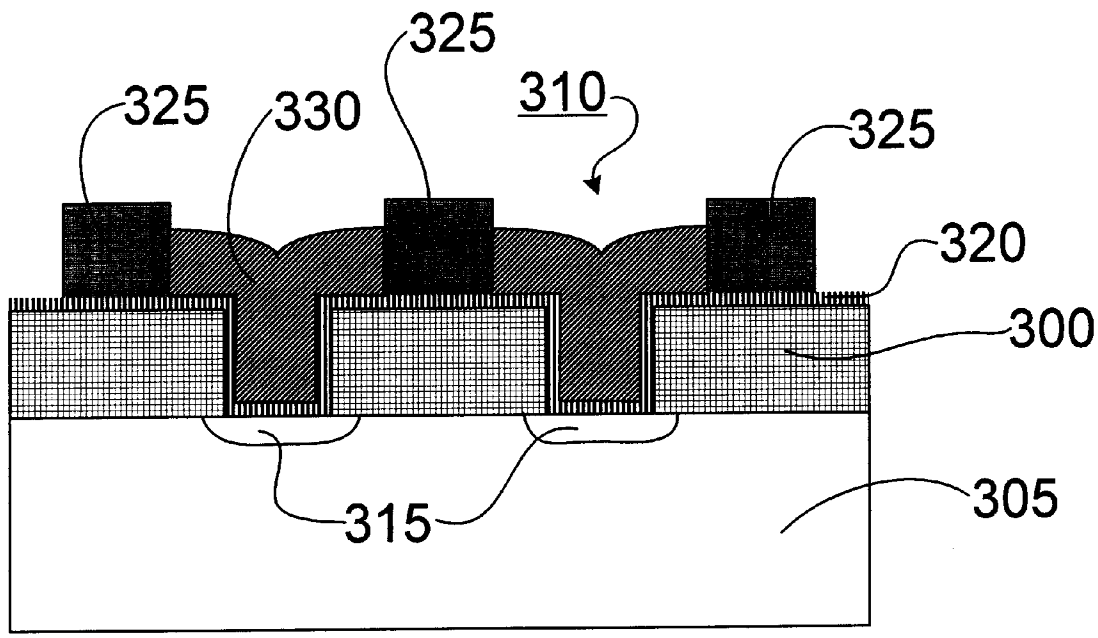
Figure 3E:
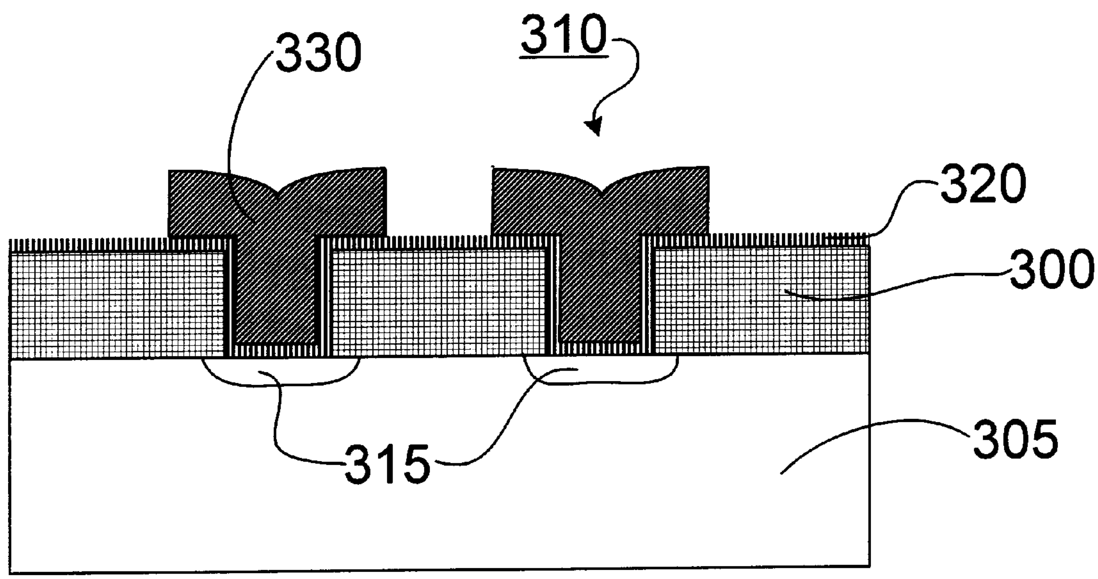

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Embodiments of a method for selectively electrochemically depositing copper according to the present invention are illustrated in FIGS. 4–10. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed towards selectively electrochemically depositing copper during the manufacture of a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

Figure 4A:
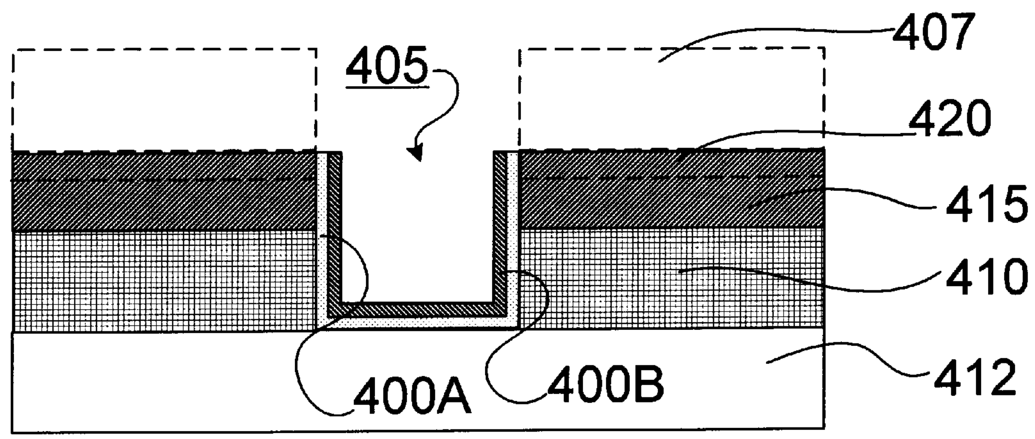
FIGS. 4A–4C show a selective copper electrodeposition process flow according to a first embodiment of the present invention.

As shown in FIG. 4A, a barrier metal layer 400A and a copper seed layer 400B may be selectively formed only in an opening (such as a trench) 405 that is formed in a layer of dielectric material 410 disposed on a structure layer 412. The structure layer 412 may be an underlayer of semiconducting material, such as a silicon substrate or wafer, for example, or, alternatively, may be an underlayer of semiconductor devices, such as a layer of metal oxide semiconductor field effect transistors (MOSFETs), and the like, and/or a metal interconnection layer or layers and/or an interlayer dielectric layer or layers, and the like.

The barrier metal and copper seed layers 400A and 400B may be blanket-deposited in the opening 405 and on top of a patterned photomask 407 (shown in phantom in FIG. 4A) that was used to form the opening 405 in the first place. When the patterned photomask is subsequently removed, the portions of the barrier metal and copper seed layers 400A and 400B overlying the patterned photomask 407 are also removed, leaving the barrier metal and copper seed layers 400A and 400B selectively formed only in the opening 405.

Alternatively, the barrier metal and copper seed layers 400A and 400B may be blanket-deposited in the opening 405 and on top of a conductive layer 415 formed of doped or undoped polysilicon, for example. Subsequently, portions of the conductive layer 415 and the portions of the barrier metal and copper seed layers 400A and 400B overlying and adjacent the conductive layer 415 may be subjected to a silicidization process. This would convert portions of the conductive layer 415 and at least the portions of the barrier metal and copper seed layers 400A and 400B overlying the conductive layer 415 into a silicide. Again, the portions of the barrier metal and copper seed layers 400A and 400B overlying the conductive layer 415 would effectively be removed, by being converted into a silicide that is later selectively covered by an insulating layer 420 (shown in phantom in FIG. 4A), leaving the unconverted and uncovered barrier metal and copper seed layers 400A and 400B selectively formed only in the opening 405.

The barrier metal layer 400A may be formed of at least one layer of a barrier metal material, such as tantalum or tantalum nitride, and the like. For example, the barrier metal layer 400A may equivalently be formed of titanium nitride, titanium-tungsten, nitrided titanium-tungsten, magnesium, or another suitable barrier material. The copper seed layer 400B may be formed on top of the one or more barrier metal layers 400A by physical vapor deposition (PVD) or chemical vapor deposition (CVD), for example.

The barrier metal and copper seed layers 400A and 400B are conductively coupled to a conductive layer 415 separately formed above the layer of dielectric material 410. The barrier metal and copper seed layers 400A and 400B make a conductive path through the barrier metal and copper seed layers 400A and 400B in the opening 405 and the conductive layer 415. The conductive layer 415 is capable of having the insulating layer 420 (shown in phantom in FIG. 4A) formed on an upper surface of the conductive layer 415. The conductive layer 415 may be conductive or may be capable of being made conductive. For example, the conductive layer 415 may include one or more of aluminum, tungsten, doped polysilicon, a conductive polymer, and the like.

Alternatively, the conductive layer 415 may be formed of doped or undoped polysilicon, and portions of the conductive layer 415 and the portions of the barrier metal and copper seed layers 400A and 400B overlying and adjacent the conductive layer 415 may be subjected to a silicidization process. This would convert portions of the conductive layer 415 and at least the portions of the barrier metal and copper seed layers 400A and 400B overlying the conductive layer 415 into a silicide that is conductive. The silicide that is formed by this silicidization process may be even more conductive than the doped or undoped polysilicon that was subjected to the silicidization process.

Figure 4B:
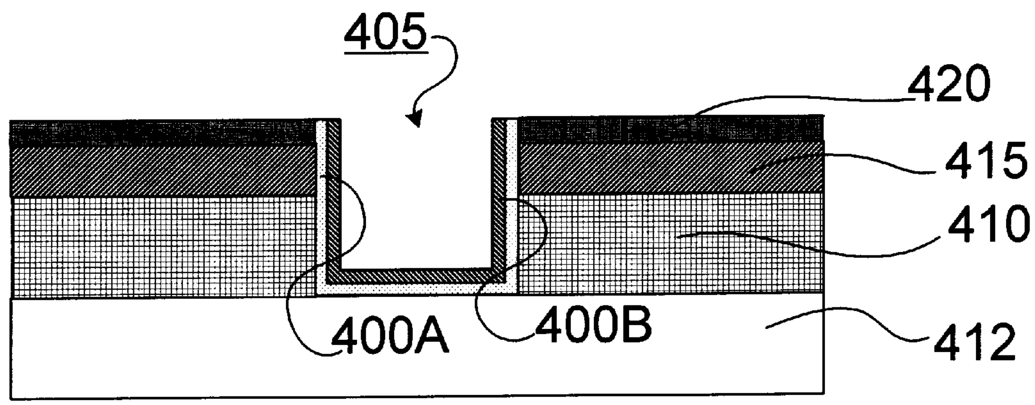

As shown in FIG. 4B, the insulating layer 420 is formed on the conductive layer 415. The insulating layer 420 may be formed on the conductive layer 415 before the opening 405 is formed in the conductive layer 415 and the dielectric layer 410. The phantom line shown in FIG. 4A would then be a solid line instead, since the insulating layer 420 would have been formed before the barrier metal and copper seed layers 400A and 400B were selectively formed in the opening 405.

Alternatively, the insulating layer 420 may be formed on the conductive layer 415 after the opening 405 is formed in the conductive layer 415 and the dielectric layer 410. The phantom line shown in FIG. 4A would then only become a solid line, as shown, in FIG. 4B, since the insulating layer 420 would have been formed only after the barrier metal and copper seed layers 400A and 400B were selectively formed in the opening 405. For example, the conductive layer 415 may be formed of doped or undoped polysilicon, for example. Subsequently, the conductive layer 415 and the portions of the barrier metal and copper seed layers 400A and 400B overlying the conductive layer 415 may be subjected to a silicidization process. This would convert portions of the conductive layer 415 and the portions of the barrier metal and copper seed layers 400A and 400B overlying the conductive layer 415 into a silicide. The insulating layer may then be selectively grown on the top surface of the silicide and not on the portions of the barrier metal and copper seed layers 400A and 400B remaining in the opening 405.

A chemical reaction may be used, for example, to selectively form the insulating layer 420 on top of the silicide. For example, the silicide may be exposed to an oxygen or nitrogen plasma, either during or after the silicidization reaction. The insulating layer 420 may be silicon dioxide ($SiO_2$) formed by the surface oxidation of a silicon-rich silicide, for example. The insulating layer 420 may equivalently be formed of silicon nitride (SiN), silicon oxynitride, metal oxide (such as MgO if magnesium is chosen as the barrier metal), or some suitable combination of these materials.

Figure 4C:
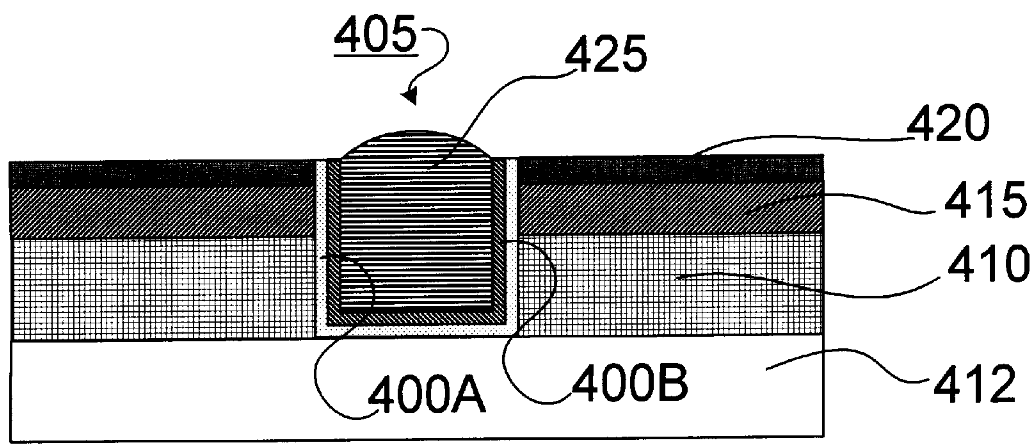

As shown in FIG. 4C, copper 425 may then be selectively electrochemically deposited only in the opening 405 and not on the insulating layer 420. Alternatively, any other suitable material besides copper may equivalently and interchangeably be selectively electrochemically deposited only in an opening in a similar manner. This first embodiment of a method for selectively electrochemically depositing copper according to the present invention, as illustrated in FIGS. 4A–4C, may be appropriate to both single-damascene copper process flows and dual-damascene copper process flows.

Figure 5A:
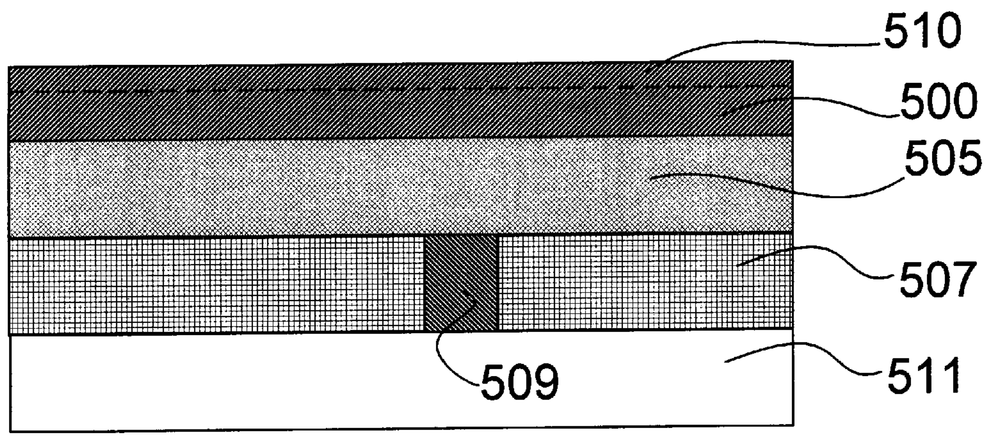
FIGS. 5A–5H show a selective copper electrodeposition process flow according to a second embodiment of the present invention.

A second embodiment of a method for selectively electrochemically depositing copper according to the present invention is illustrated in FIGS. 5A–5H. As shown in FIG. 5A, a conductive layer 500 may be formed (for example, by being deposited) on a layer of dielectric material 505. The layer of dielectric material 505 is formed (for example, by being deposited) on another dielectric layer 507. The layer of dielectric material 505 may be an interlayer dielectric (ILD). The other dielectric layer 507 has an intermetal via connection 509 disposed therein. The conductive layer 500 is capable of having an insulating layer 510 (shown in phantom in FIG. 5A) formed on an upper surface of the conductive layer 500. The conductive layer 500 may be conductive or may be capable of being made conductive. The other dielectric layer 507 is disposed on a structure layer 511. The structure layer 511 may be an underlayer of semiconducting material, such as a silicon substrate or wafer, for example, or, alternatively, may be an underlayer of semiconductor devices, such as a layer of metal oxide semiconductor field effect transistors (MOSFETs), and the like, and/or a metal interconnection layer or layers and/or an interlayer dielectric layer or layers, and the like.

Figure 5B:
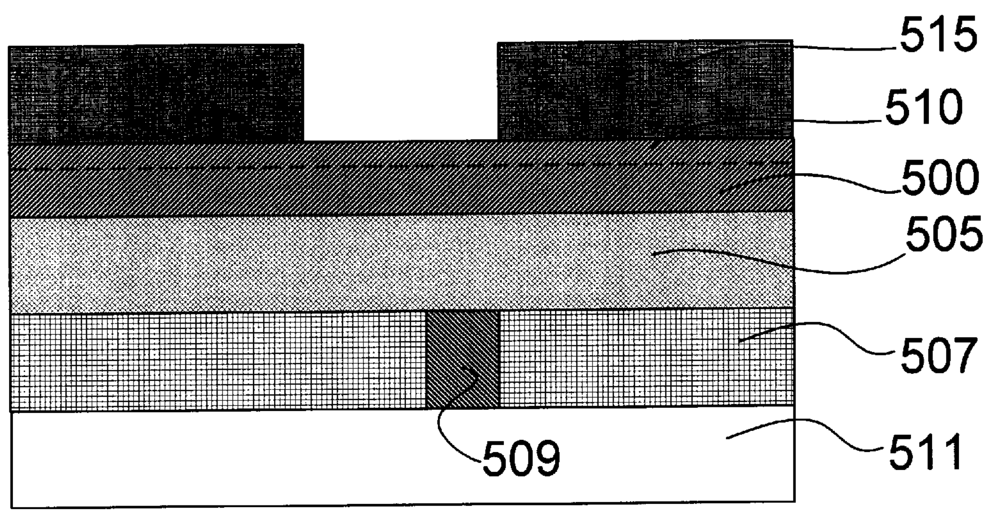
Figure 5C:
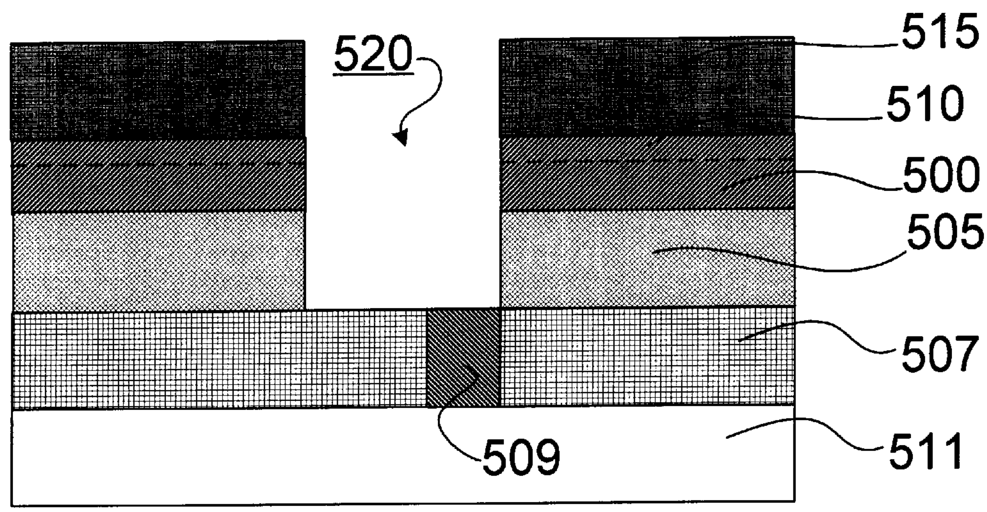
Figure 5D:
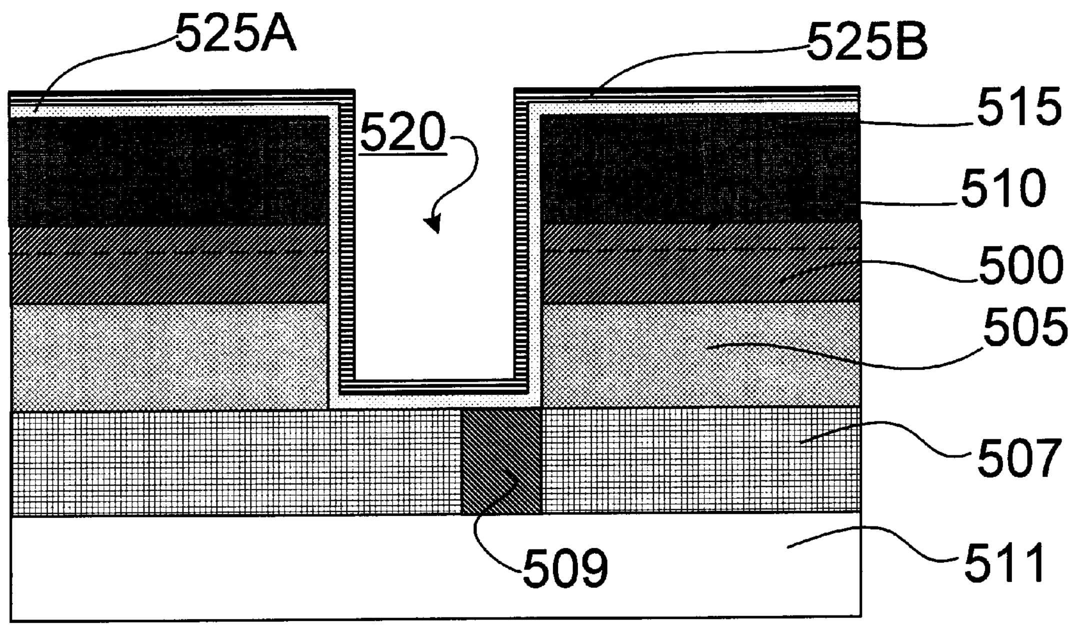

As shown in FIG. 5B, a masking layer 515 may be formed on the conductive layer 500, for example, by being applied and patterned thereon. The masking layer 515 may be formed of photoresist, for example. As shown in FIG. 5C, the conductive layer 500 and the layer of dielectric material 505 may be etched to form an opening (such as a trench) 520. As shown in FIG. 5D, a barrier metal layer 525A and a copper seed layer 525B are formed (for example, by being deposited) in the opening 520 and are conductively coupled to the conductive layer 500. The barrier metal and copper seed layers 525A and 525B may make a conductive path through the barrier metal and copper seed layers 525A and 525B in the opening 520 and through the conductive layer 500.

The barrier metal layer 525A may be formed of at least one layer of a barrier metal material, such as tantalum or tantalum nitride, and the like. For example, the barrier metal layer 525A may equivalently be formed of titanium nitride, titanium-tungsten, nitrided titanium-tungsten, magnesium, or another suitable barrier material. The copper seed layer 525B may be formed on top of the one or more barrier metal layers 525A by physical vapor deposition (PVD) or chemical vapor deposition (CVD), for example.

Figure 5E:
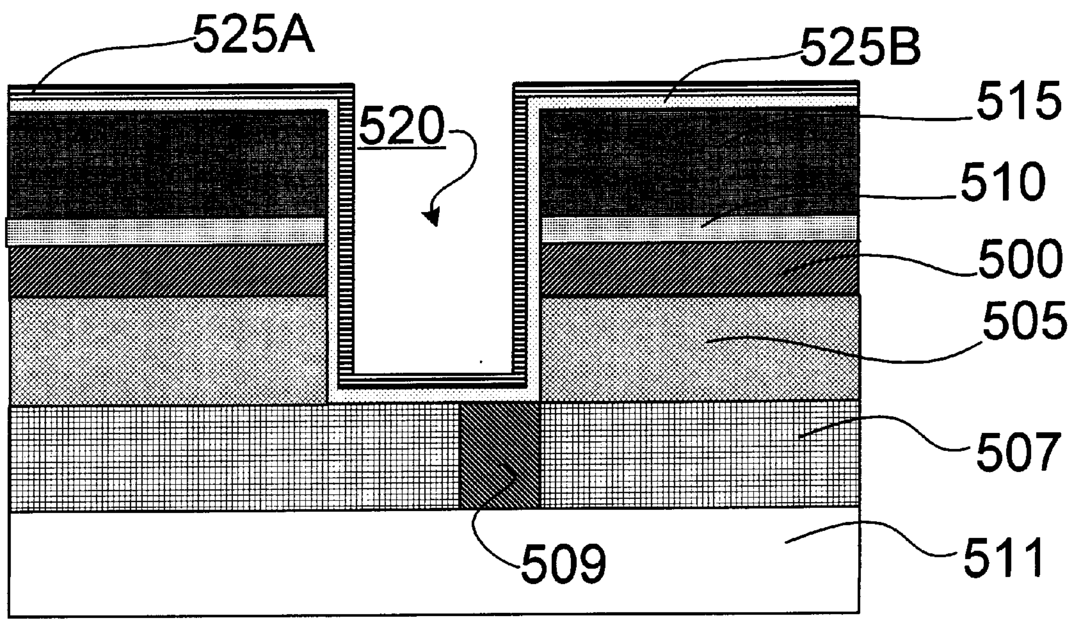

As shown in FIG. 5E, the insulating layer 510 is formed on the conductive layer 500. The insulating layer 510 may be formed on the conductive layer 500 before the opening 520 is formed in the conductive layer 500 and the dielectric layer 505. The phantom line shown in FIG. 5A would then be a solid line instead, since the insulating layer 510 would have been formed before the barrier metal and copper seed layers 525A and 525B were formed in the opening 520. Alternatively, the insulating layer 510 may be formed on the conductive layer 500 after the opening 520 is formed in the conductive layer 500 and the dielectric layer 505. The phantom line shown in FIG. 5A would then only become a solid line, as shown, in FIG. 5E, since the insulating layer 510 would have been formed only after the barrier metal and copper seed layers 525A and 525B were formed in the opening 520.

Figure 5F:
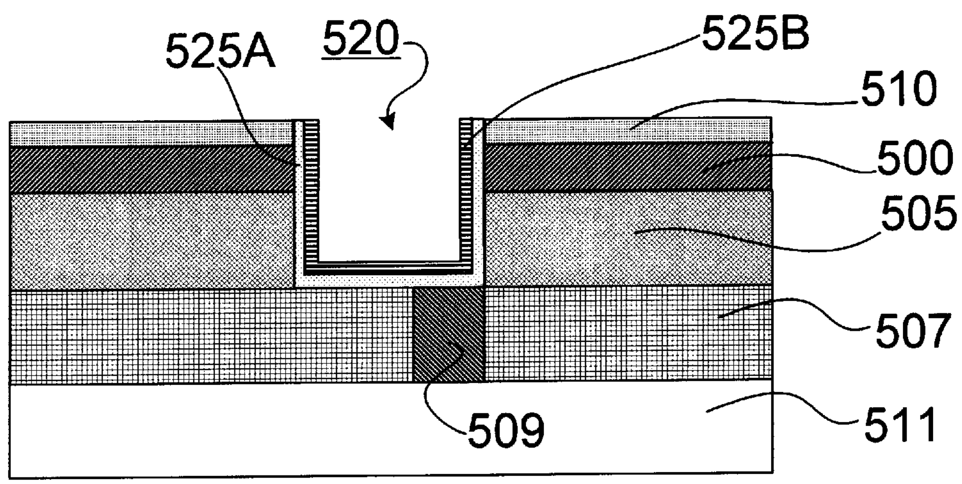

As shown in FIG. 5F, the masking layer 515, along with portions of the barrier metal and copper seed layers 525A and 525B overlying the masking layer 515, may be removed. For example, a masking layer 515 formed of photoresist may be removed by being stripped off in a solvent bath. Alternatively, the masking layer 515 may be removed before the barrier metal and copper seed layers 525A and 525B are formed (for example, by being deposited) to make a conductive path through the barrier metal and copper seed layers 525A and 525B in the opening 520 and through the conductive layer 500. The barrier metal and copper seed layers 525A and 525B shown in FIG. 5D would then be deposited directly on the conductive layer 500, since the masking layer 515 would have been removed before the barrier metal and copper seed layers 525A and 525B were deposited.

Figure 5G:
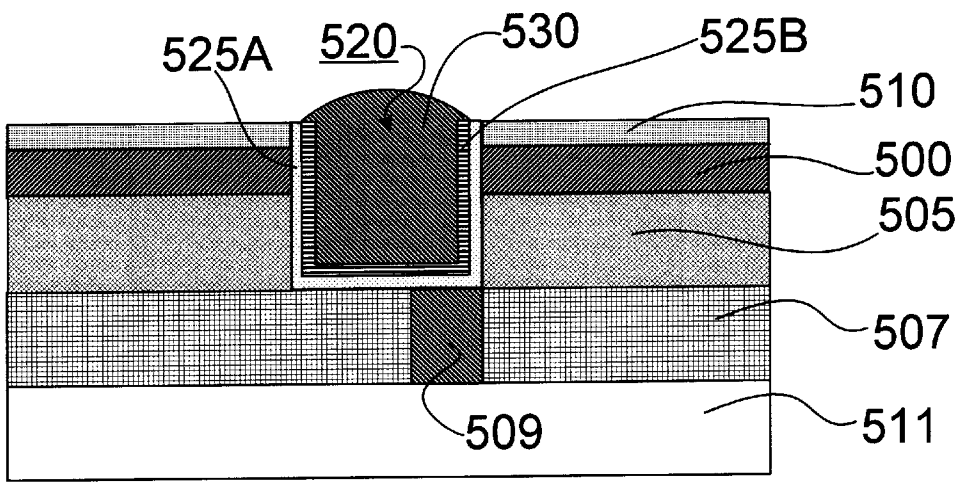
Figure 5H:
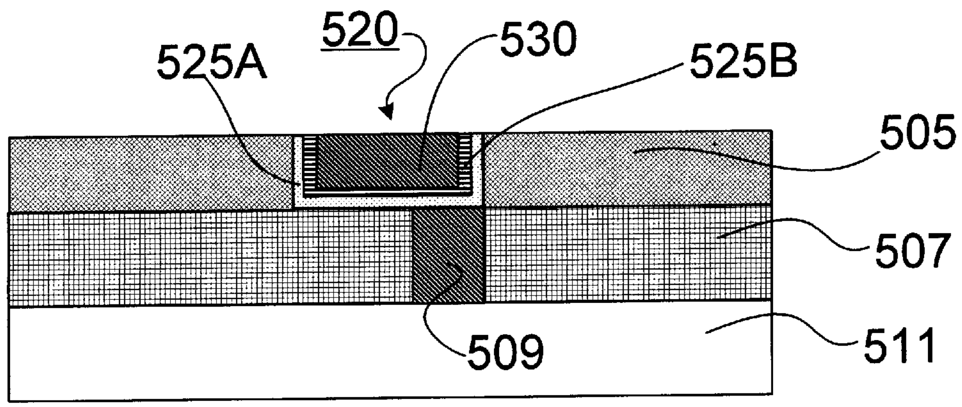

As shown in FIG. 5G, copper 530 may then be selectively electrochemically deposited only in the opening 520 and not on the insulating layer 510. As shown in FIG. 5H, excess copper 530 deposited in the opening 520 may be removed, along with the insulating layer 510 and the conductive layer 500, by CMP, for example. This second embodiment of a method for selectively electrochemically depositing copper according to the present invention, as illustrated in FIGS. 5A–5H, may also be appropriate to both single-damascene copper process flows and dual-damascene copper process flows.

Figure 6A:
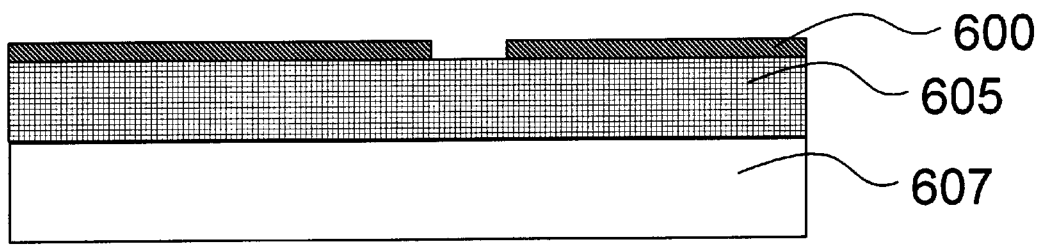
FIGS. 6A–6J show a selective copper electrodeposition process flow according to a third embodiment of the present invention.
Figure 6B:
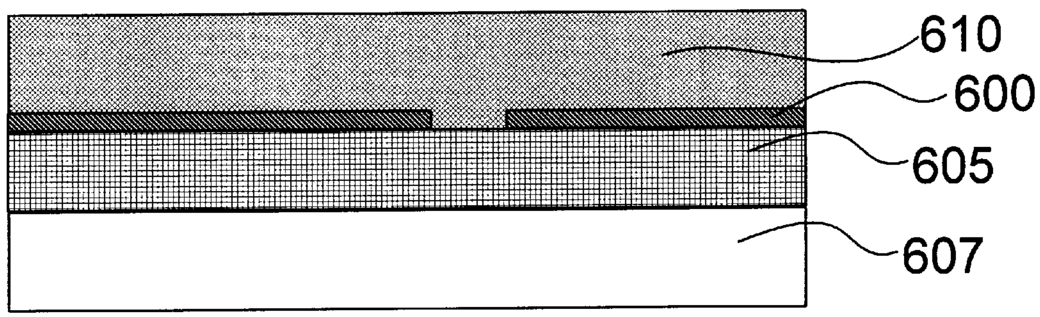

A third embodiment of a method for selectively electrochemically depositing copper according to the present invention is illustrated in FIGS. 6A–6J. As shown in FIG. 6A, a first masking layer 600 may be formed (for example, by being deposited and patterned) on a first layer of dielectric material 605. The first layer of dielectric material 605 may be disposed on a structure layer 607. The structure layer 607 may be an underlayer of semiconducting material, such as a silicon substrate or wafer, for example, or, alternatively, may be an underlayer of semiconductor devices, such as a layer of metal oxide semiconductor field effect transistors (MOSFETs), and the like, and/or a metal interconnection layer or layers and/or an interlayer dielectric layer or layers, and the like. As shown in FIG. 6B, a second layer of dielectric material 610 may be formed (for example, by being deposited) on the first layer of dielectric material 605.

Figure 6C:
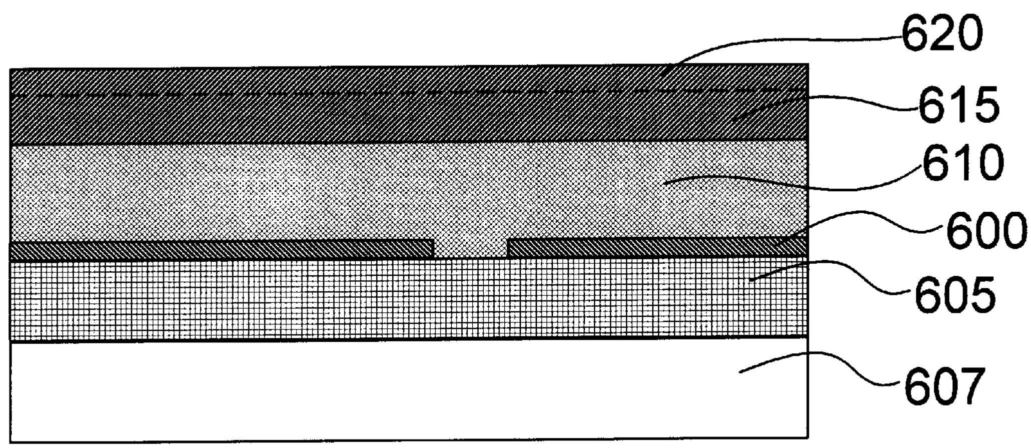

As shown in FIG. 6C, a conductive layer 615 may be formed (for example, by being deposited) on the second layer of dielectric material 610. The conductive layer 615 is capable of having an insulating layer 620 (shown in phantom in FIG. 6C) formed on an upper surface of the conductive layer 615. The conductive layer 615 may be conductive or may be capable of being made conductive.

Figure 6D:
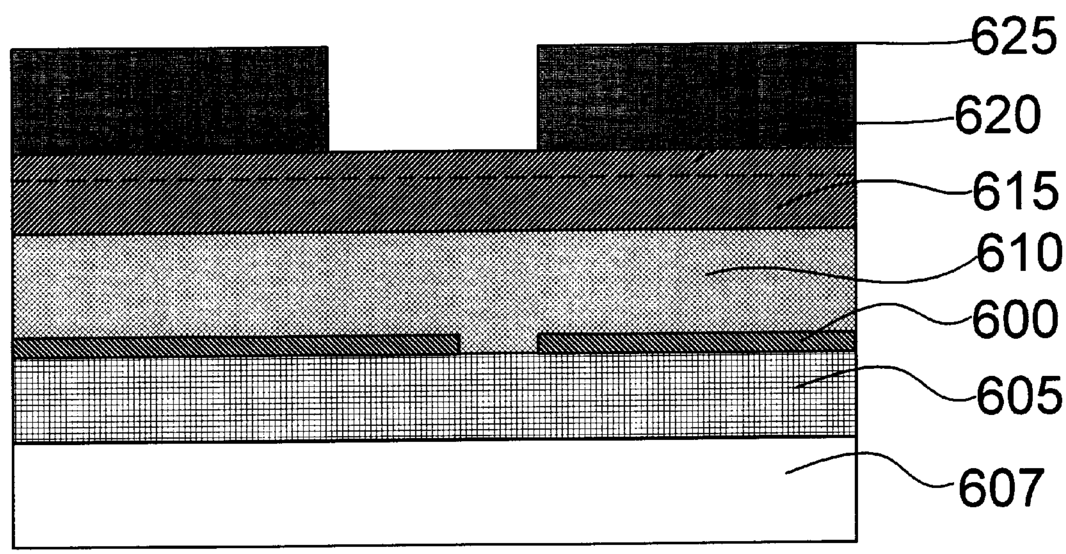
Figure 6E:
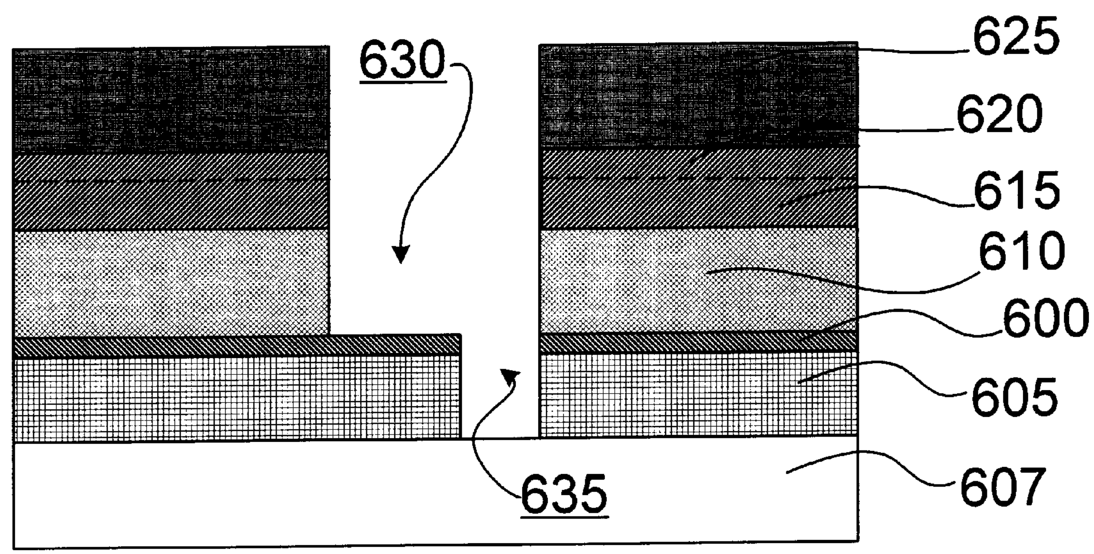
Figure 6F:
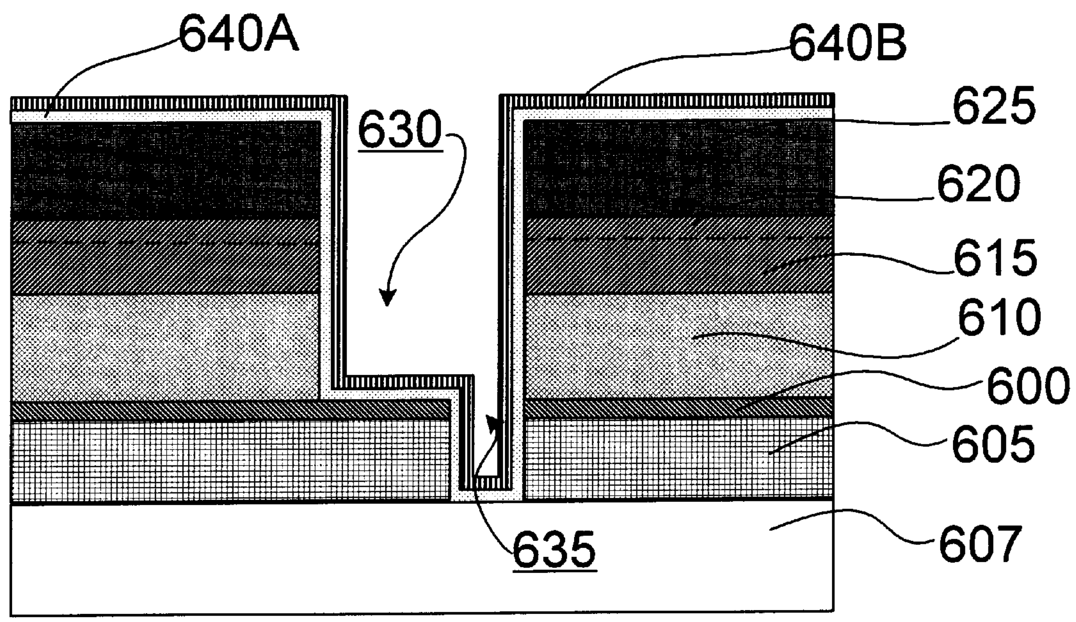

As shown in FIG. 6D, a second masking layer 625 may be formed on the conductive layer 615, for example, by being applied and patterned thereon. The second masking layer 625 may be formed of photoresist, for example. As shown in FIG. 6E, the conductive layer 615 and the second layer of dielectric material 610 may be etched to form a first opening 630 and the first layer of dielectric material 605 may be etched to form a second opening 635. As shown in FIG. 6F, a barrier metal layer 640A and a copper seed layer 640B are formed (for example, by being deposited) in the first and second openings 630 and 635 and are conductively coupled to the conductive layer 615. The barrier metal and copper seed layers 640A and 640B may make a conductive path through the barrier metal and copper seed layers 640A and 640B in the first and second openings 630 and 635 and through the conductive layer 615.

The barrier metal layer 640A may be formed of at least one layer of a barrier metal material, such as tantalum or tantalum nitride, and the like. For example, the barrier metal layer 640A may equivalently be formed of titanium nitride, titanium-tungsten, nitrided titanium-tungsten, magnesium, or another suitable barrier material. The copper seed layer 640B may be formed on top of the one or more barrier metal layers 640A by physical vapor deposition (PVD) or chemical vapor deposition (CVD), for example.

Figure 6G:
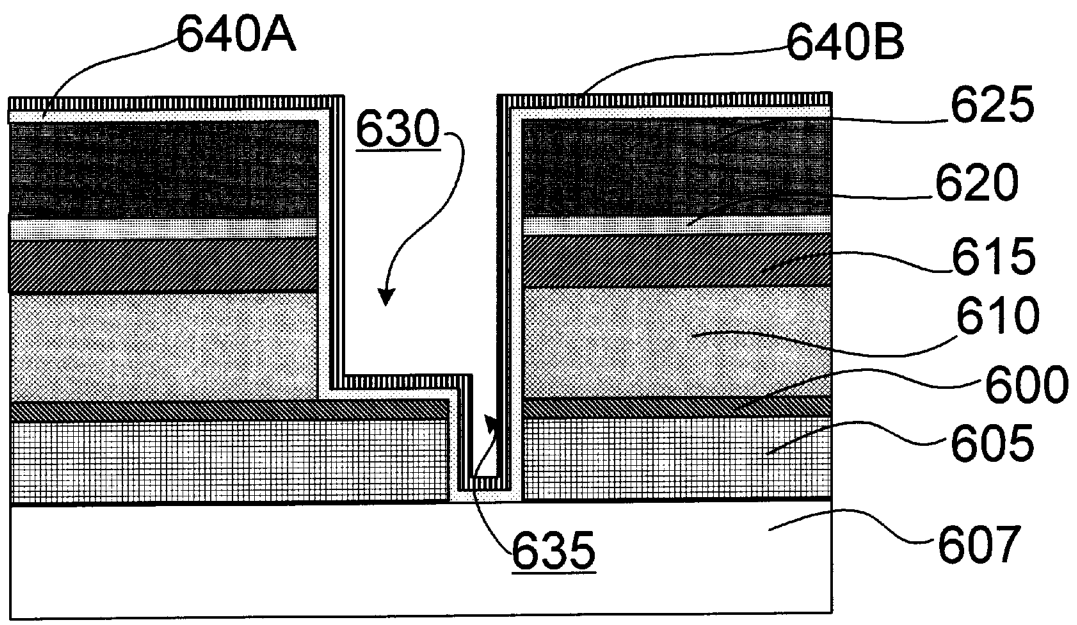

As shown in FIG. 6G, the insulating layer 620 is formed on the conductive layer 615. The insulating layer 620 may be formed on the conductive layer 615 before the first and second openings 630 and 635 are formed in the conductive layer 615 and the first and second dielectric layers 605 and 610. The phantom line shown in FIG. 6C would then be a solid line instead, since the insulating layer 620 would have been formed before the barrier metal and copper seed layers 640A and 640B were formed in the first and second openings 630 and 635.

Alternatively, the insulating layer 620 may be formed on the conductive layer 615 after the first and second openings 630 and 635 are formed in the conductive layer 615 and the first and second dielectric layers 605 and 610. The phantom line shown in FIG. 6C would then only become a solid line, as shown, in FIG. 6G, since the insulating layer 620 would have been formed only after the barrier metal and copper seed layers 640A and 640B were formed in the first and second openings 630 and 635.

Figure 6H:
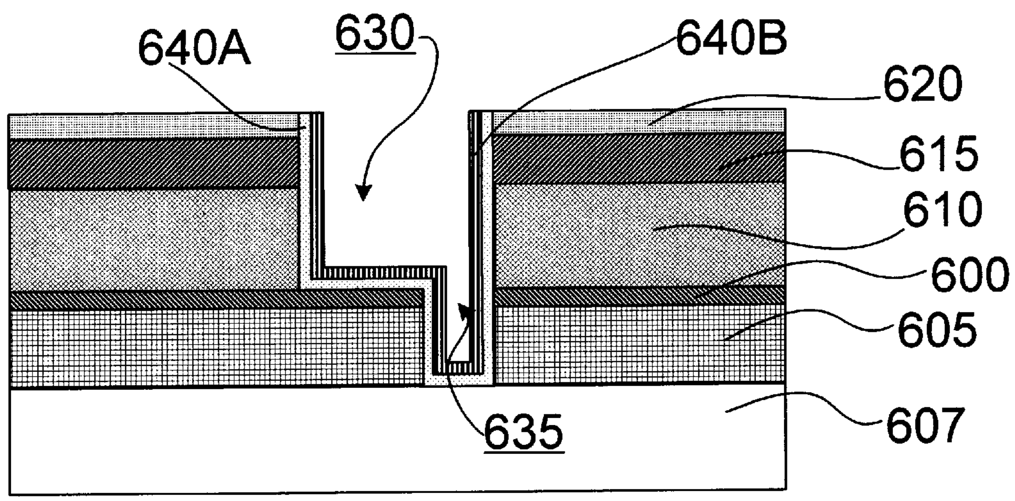

As shown in FIG. 6H, the second masking layer 625, along with portions of the barrier metal and copper seed layers 640A and 640B overlying the second masking layer 625, may be removed. For example, a second masking layer 625 formed of photoresist may be removed by being stripped off in a solvent bath. Alternatively, the second masking layer 625 may be removed before the barrier metal and copper seed layers 640A and 640B are formed (for example, by being deposited) to make a conductive path through the barrier metal and copper seed layers 640A and 640B in the openings 630 and 635 and through the conductive layer 615. The barrier metal and copper seed layers 640A and 640B shown in FIG. 6F would then be deposited directly on the conductive layer 615, since the second masking layer 625 would have been removed before the barrier metal and copper seed layers 640A and 640B were deposited.

Figure 6I:
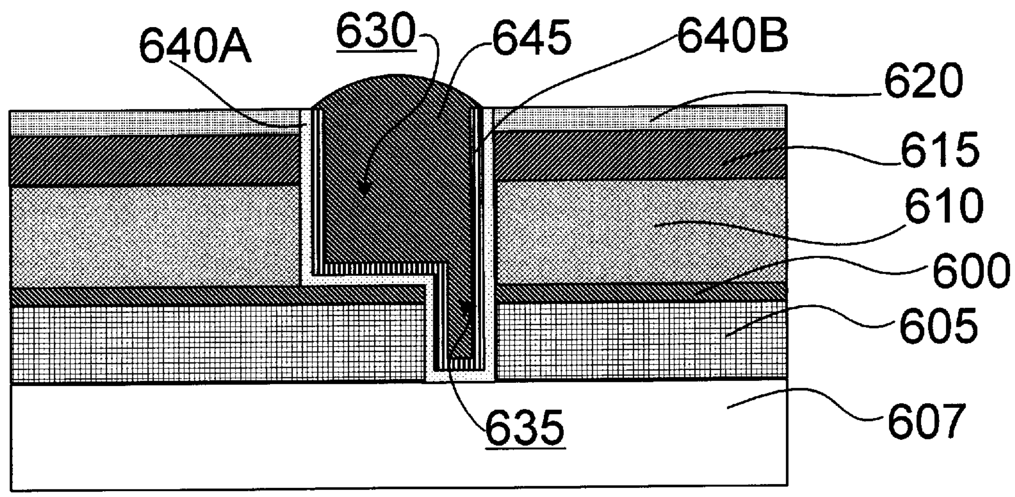
Figure 6J:
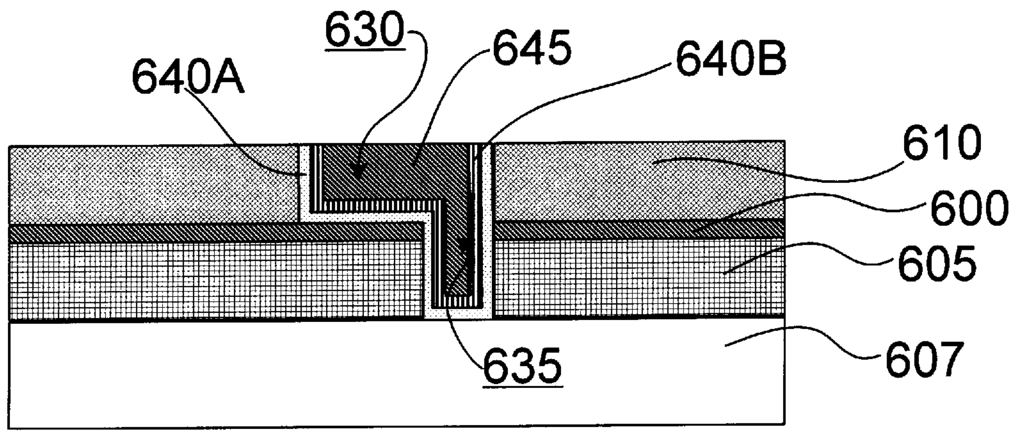

As shown in FIG. 6I, copper 645 may then be selectively electrochemically deposited only in the first and second openings 630 and 635 and not on the insulating layer 620. As shown in FIG. 6J, excess copper 645 deposited in the first opening 630 may be removed, along with the insulating layer 620 and the conductive layer 615, by CMP, for example. This third embodiment of a method for selectively electrochemically depositing copper according to the present invention, as illustrated in FIGS. 6A–6J, may also be appropriate to both single-damascene copper process flows and dual-damascene copper process flows.

Figure 7A:
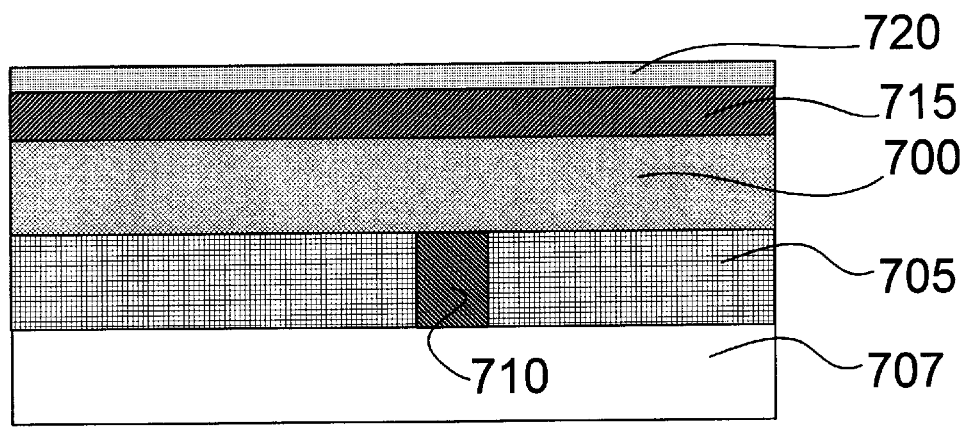
FIGS. 7A–7G show a selective copper electrodeposition process flow according to a fourth embodiment of the present invention.

A single-damascene copper process flow, in a fourth embodiment of a method for selectively electrochemically depositing copper according to the present invention, is illustrated in FIGS. 7A–7G. As shown in FIG. 7A, a first dielectric layer 700 is formed (for example, by being deposited) on a second dielectric layer 705 on a structure layer 707. The structure layer 707 may be an underlayer of semiconducting material, such as a silicon substrate or wafer, for example, or, alternatively, may be an underlayer of semiconductor devices, such as a layer of metal oxide semiconductor field effect transistors (MOSFETs), and the like, and/or a metal interconnection layer or layers and/or an interlayer dielectric layer or layers, and the like. The first dielectric layer 700 may be an interlayer dielectric (ILD). The second dielectric layer 705 has an intermetal via connection 710 disposed therein. If necessary, the first dielectric layer 700 is planarized using chemical-mechanical planarization (CMP). A conductive metallization layer of aluminum 715 is formed (for example, by being deposited) on the first dielectric layer 700 before the patterning of the openings. The conductive metallization layer 715 may equivalently be formed of tungsten, a conductive polymer, or another suitable conductive material.

As shown in FIG. 7A, a thin dielectric layer of silicon dioxide ($SiO_2$) 720 is formed (for example, by being deposited) on top of the conductive metallization layer of aluminum 715 on an upper surface thereof. The thin dielectric layer 720 may equivalently be formed of an oxide, a nitride, spin-on-glass (SOG), an insulating polymer, or another suitable insulating material.

Figure 7B:
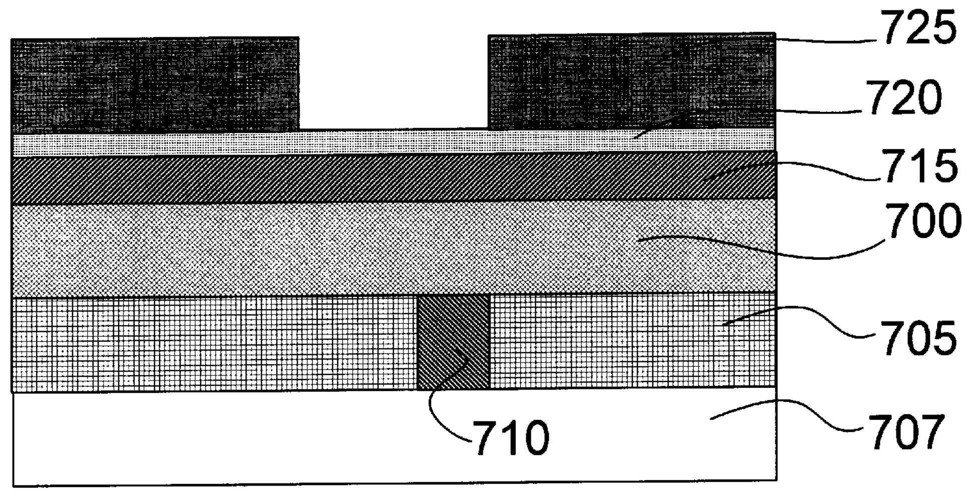
Figure 7C:
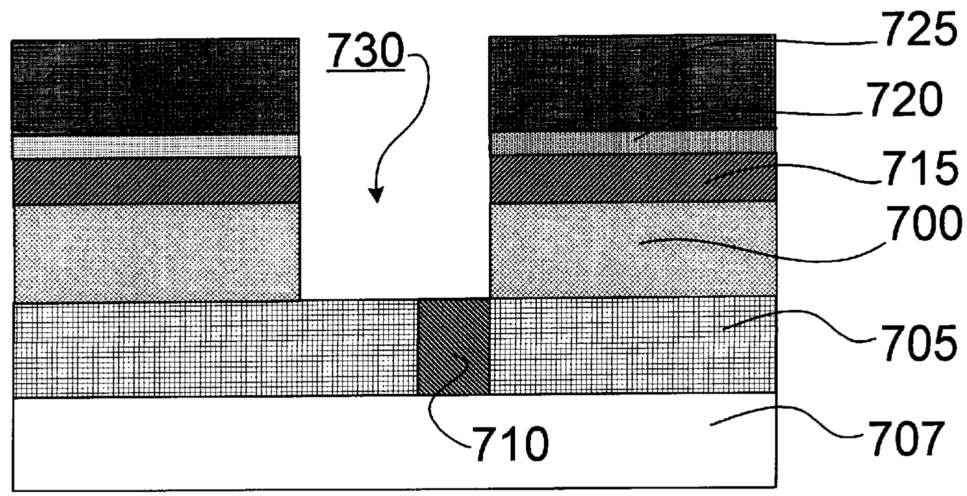

As shown in FIG. 7B, a metallization pattern is then applied using a patterned photomask 725 and photolithography. The photomask 725 may be formed of photoresist, for example. As shown in FIG. 7C, openings (such as opening 730) for conductive metal lines, contact holes, via holes, and the like, are etched, in a multi-step process, through the thin dielectric layer of $SiO_2$ 720 and the conductive metallization layer of aluminum 715 and into the first dielectric layer 700. The patterned photomask 725 is not removed at this point.

Figure 7D:
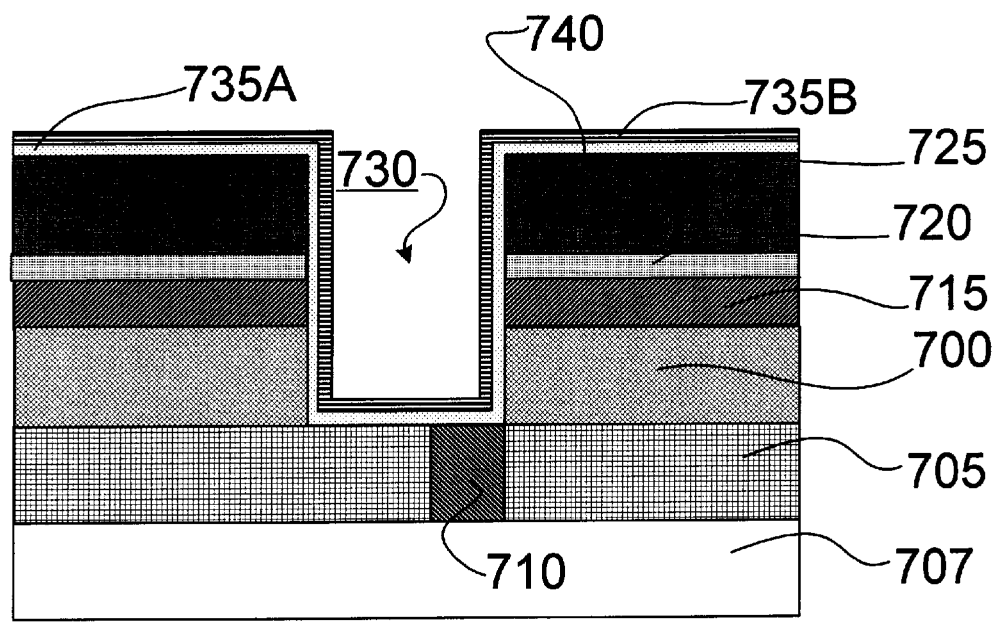
Figure 7E:
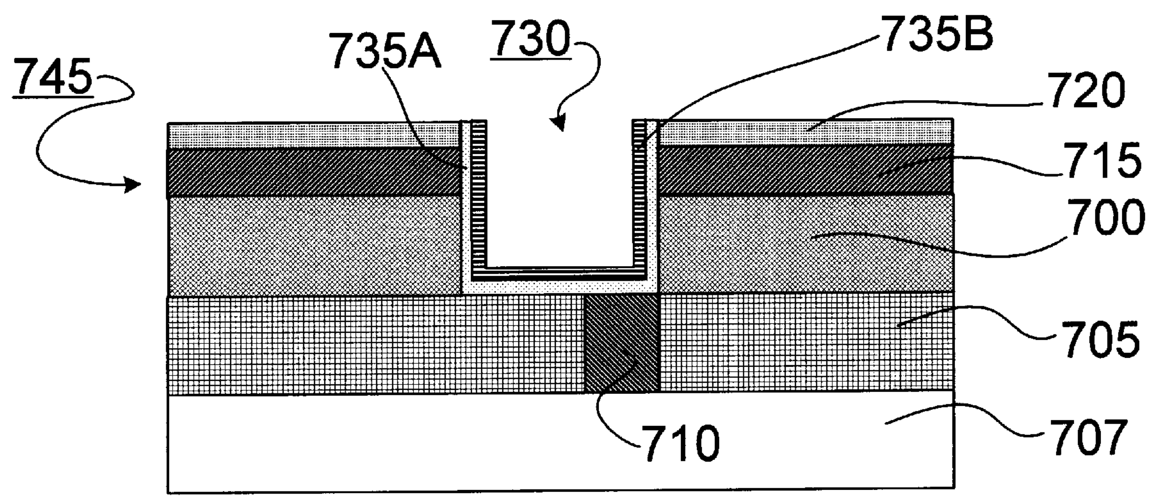

As shown in FIG. 7D, a thin barrier metal layer of tantalum 735A and a copper seed layer 735B are then applied to the entire surface using vapor-phase deposition. The barrier metal layer 735A may equivalently be formed of titanium nitride, titanium-tungsten, tantalum nitride, nitrided titanium-tungsten, magnesium, or another suitable barrier material. The tantalum barrier metal layer 735A and the copper seed layer 735B blanket-deposit the entire upper surface 740 of the patterned photomask 725 as well as the side and bottom surfaces of the opening 730. The patterned photomask 725 is then removed by being wet-stripped off in a solvent bath (not shown), resulting in the lifting-off of the portions of the tantalum barrier metal layer 735A and the copper seed layer 735B that overlie the patterned photomask 725, as shown in FIG. 7E.

The insulated conductive metallization layer of aluminum 715 (insulated by the thin dielectric layer of $SiO_2$ 720) now provides a conductive path 745 conductively coupling and connecting the tantalum barrier metal layer 735A and the copper seed layer 735B in the openings (such as opening 730) across the entire wafer on which the structure layer 707 is disposed. The insulating thin dielectric layer of $SiO_2$ 720 prevents electrochemical deposition in unwanted areas.

The bulk of the copper opening-fill may be done using an electroplating technique, where the conductive path 745 is mechanically clamped (or the insulating thin dielectric layer of $SiO_2$ 720 may be selectively stripped at the wafer edge) to establish an electrical contact. The wafer is then immersed in an electrolyte solution containing copper ions (not shown). An electrical current is then passed through the wafer-electrolyte system to cause reduction and deposition of copper only on the copper seed layer 735B in the openings (such as opening 730).

Figure 7F:
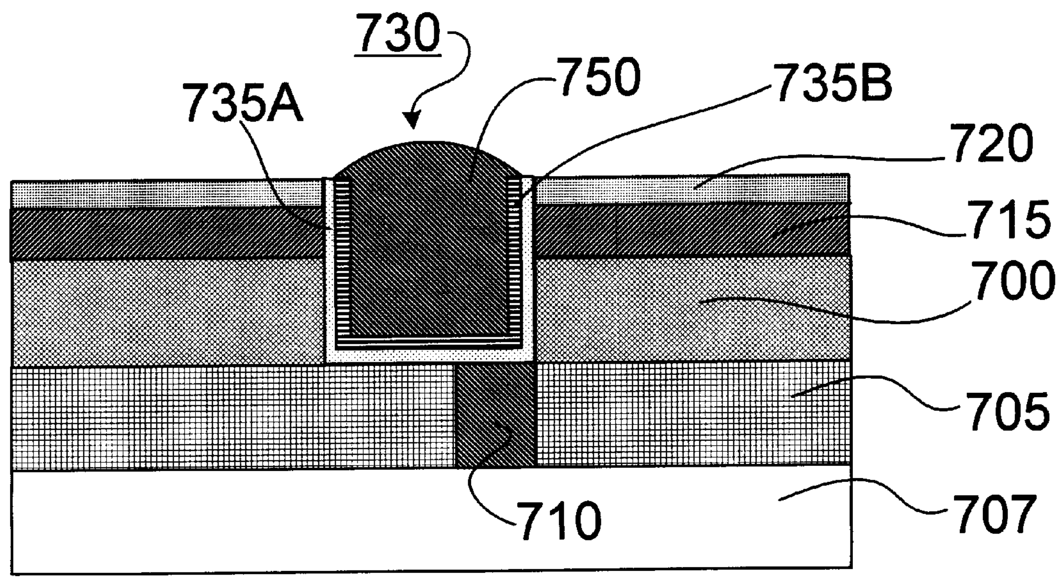
Figure 7G:
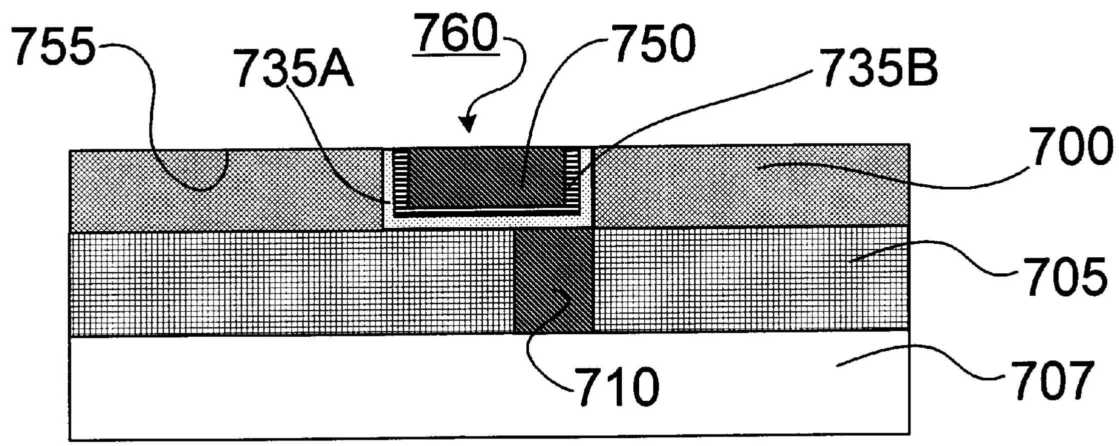

This process produces a copper opening-fill 750 only in the openings (such as opening 730), as shown in FIG. 7F. Once a sufficient opening-fill of copper 750 has been deposited, the surface of the wafer may be planarized using CMP techniques. Ideally, this removes all excess copper opening-fill 750 in the openings (such as opening 730) as well as the insulated conductive metallization layer of aluminum 715 (insulated by the thin dielectric layer of $SiO_2$ 720) from the entire upper surface 755 of the first dielectric layer 700. Copper is then left only in the copper-filled openings (such as copper-filled opening 760), as shown in FIG. 7G.

Figure 8A:
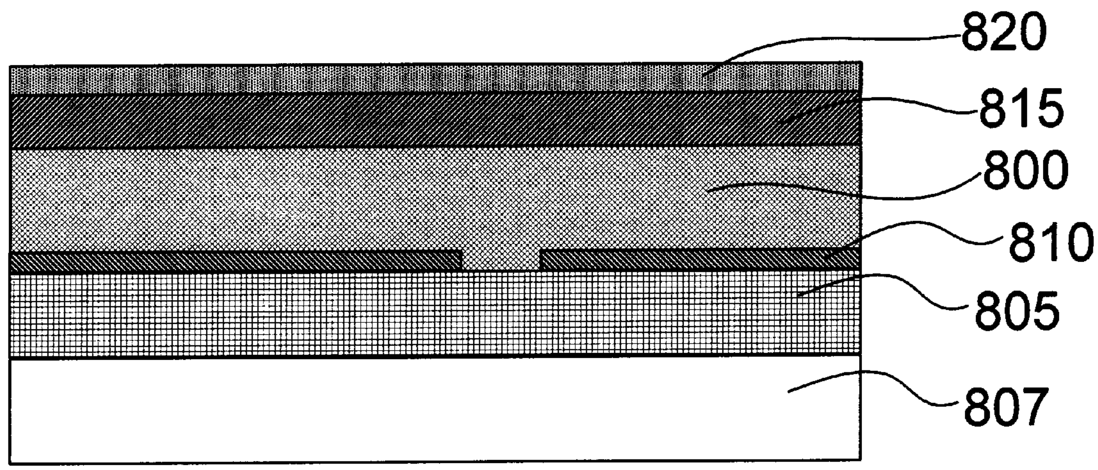
FIGS. 8A–8G show a selective copper electrodeposition process flow according to a fifth embodiment of the present invention.

A dual-damascene copper process flow, in a fifth embodiment of a method for selectively electrochemically depositing copper according to the present invention, is illustrated in FIGS. 8A–8G. As shown in FIG. 8A, a first dielectric layer 800 is formed (for example, by being deposited) on a second dielectric layer 805 on a structure layer 807. The structure layer 807 may be an underlayer of semiconducting material, such as a silicon substrate or wafer, for example, or, alternatively, may be an underlayer of semiconductor devices, such as a layer of metal oxide semiconductor field effect transistors (MOSFETs), and the like, and/or a metal interconnection layer or layers and/or an interlayer dielectric layer or layers, and the like. The first dielectric layer 800 may be an interlayer dielectric (ILD). The second dielectric layer 805 has a "hard mask" of silicon nitride (SiN) 810 formed (for example, by being deposited and patterned) thereon, between the first dielectric layer 800 and the second dielectric layer 805. If necessary, the first dielectric layer 800 is planarized using chemical-mechanical planarization (CMP). A conductive metallization layer of aluminum 815 is formed (for example, by being deposited) on the first dielectric layer 800 before the patterning of the openings. The conductive metallization layer 815 may equivalently be formed of tungsten, a conductive polymer, or another suitable conductive material.

As shown in FIG. 8A, a thin dielectric layer of silicon dioxide ($SiO_2$) 820 is formed (for example, by being deposited) on top of the conductive metallization layer of aluminum 815 on an upper surface thereof. The thin dielectric layer 820 may equivalently be formed of an oxide, a nitride, spin-on-glass (SOG), an insulating polymer, or another suitable insulating material.

Figure 8B:
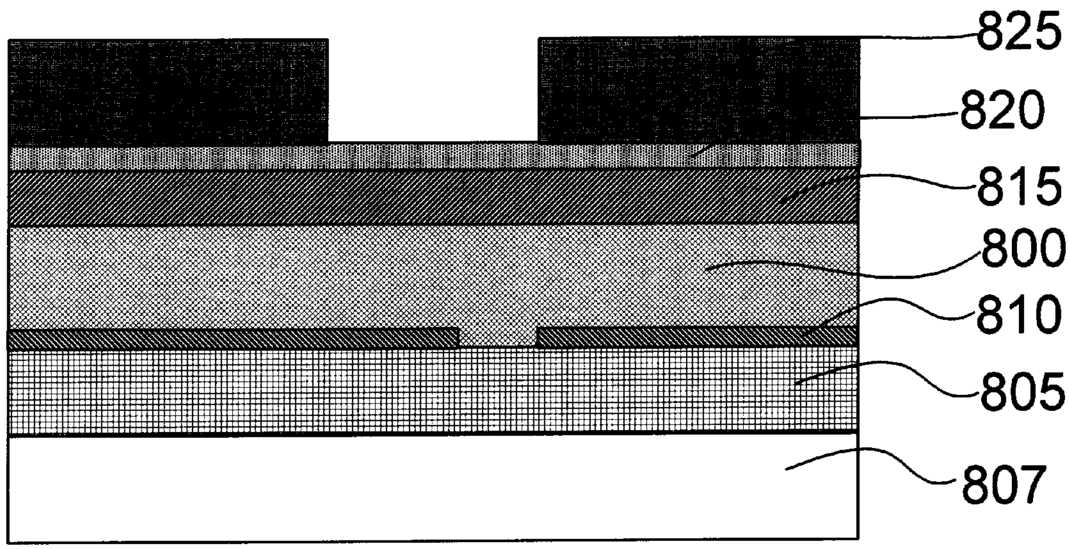
Figure 8C:
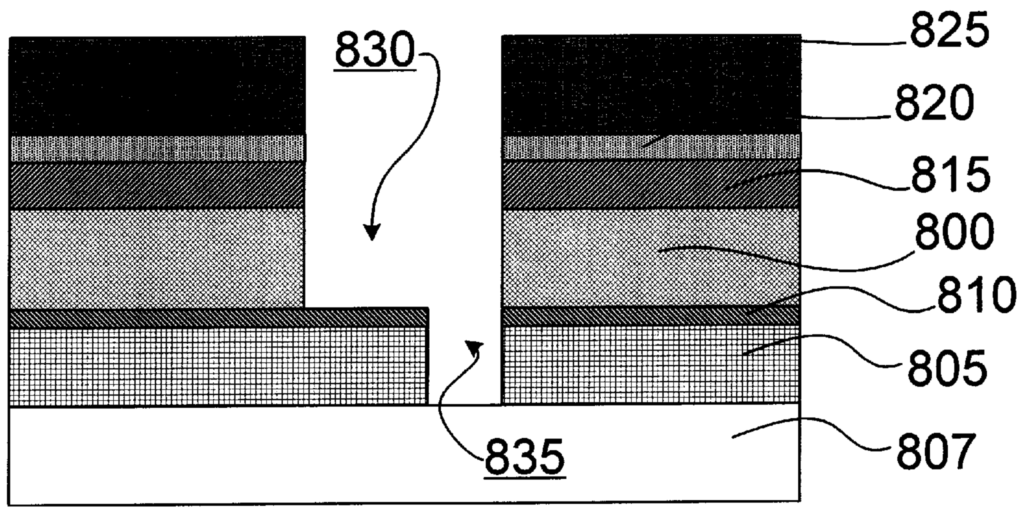

As shown in FIG. 8B, a metallization pattern is then applied using a patterned photomask 825 and photolithography. The photomask 825 may be formed of photoresist, for example. As shown in FIG. 8C, openings (such as openings 830 and 835) for conductive metal lines, contact holes, via holes, and the like, are etched, in a multi-step process, through the thin dielectric layer of $SiO_2$ 820 and the conductive metallization layer of aluminum 815 and the first dielectric layer 800 and into the second dielectric layer 805. The patterned hard mask of SiN 810 determines the amount of etching of the second dielectric layer 805. The patterned photomask 825 is not removed at this point.

Figure 8D:
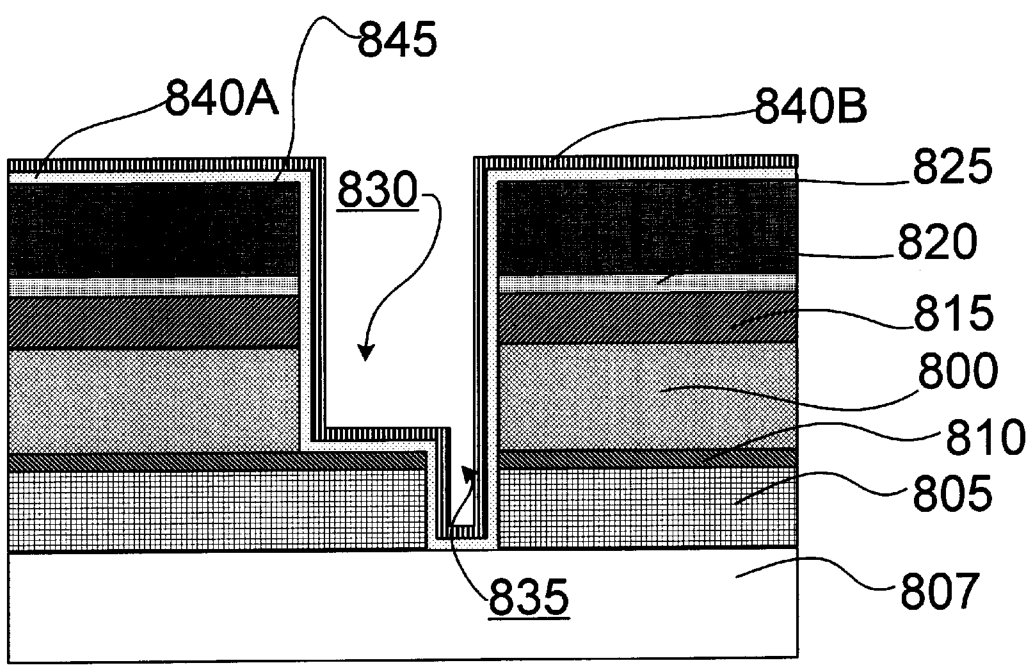
Figure 8E:
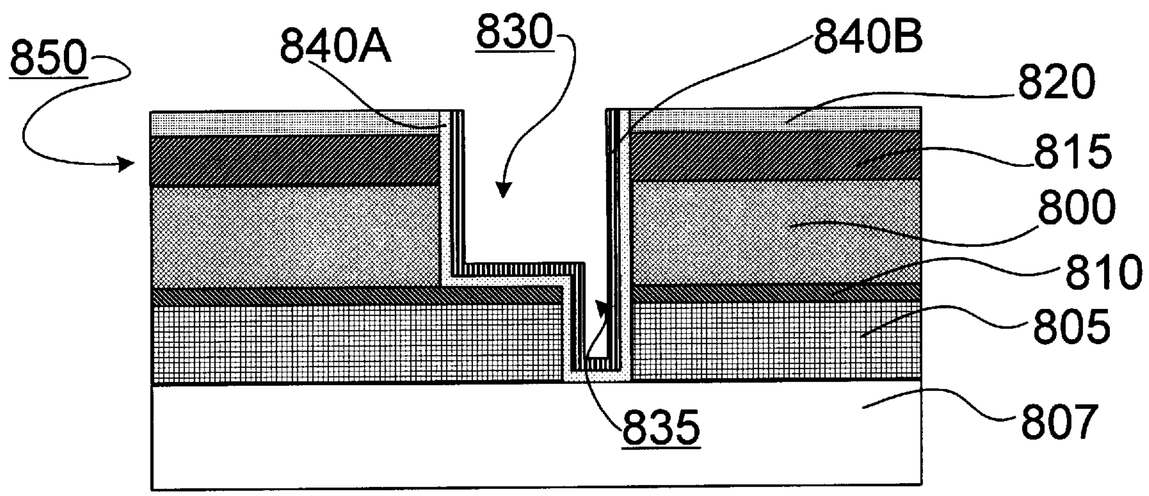

As shown in FIG. 8D, a thin barrier metal layer of tantalum 840A and a copper seed layer 840B are then applied to the entire surface using vapor-phase deposition. The barrier metal layer 840A may equivalently be formed of titanium nitride, titanium-tungsten, tantalum nitride, nitrided titanium-tungsten, magnesium, or another suitable barrier material. The tantalum barrier metal layer 840A and the copper seed layer 840B blanket-deposit the entire upper surface 845 of the patterned photomask 825 as well as the side and bottom surfaces of the openings 830 and 835. The patterned photomask 825 is then removed by being wet-stripped off in a solvent bath (not shown), resulting in the lifting-off of the portions of the tantalum barrier metal layer 840A and the copper seed layer 840B that overlie the patterned photomask 825, as shown in FIG. 8E.

The insulated conductive metallization layer of aluminum 815 (insulated by the thin dielectric layer of $SiO_2$ 820) now provides a conductive path 850 conductively coupling and connecting the tantalum barrier metal layer 840A and the copper seed layer 840B in the openings (such as openings 830 and 835) across the entire wafer on which the structure layer 807 is disposed. The insulating thin dielectric layer of $SiO_2$ 820 prevents electrochemical deposition in unwanted areas.

The bulk of the copper opening-fill may be done using an electroplating technique, where the conductive path 850 is mechanically clamped (or the insulating thin dielectric layer of $SiO_2$ 820 may be selectively stripped at the wafer edge) to establish an electrical contact. The wafer is then immersed in an electrolyte solution containing copper ions (not shown). An electrical current is then passed through the wafer-electrolyte system to cause reduction and deposition of copper only on the copper seed layer 840B in the openings (such as openings 830 and 835).

Figure 8F:
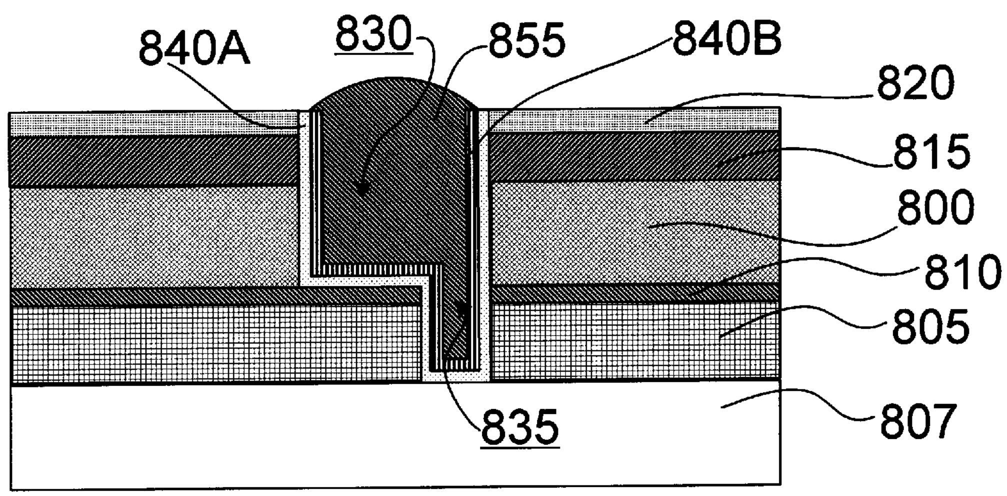
Figure 8G:
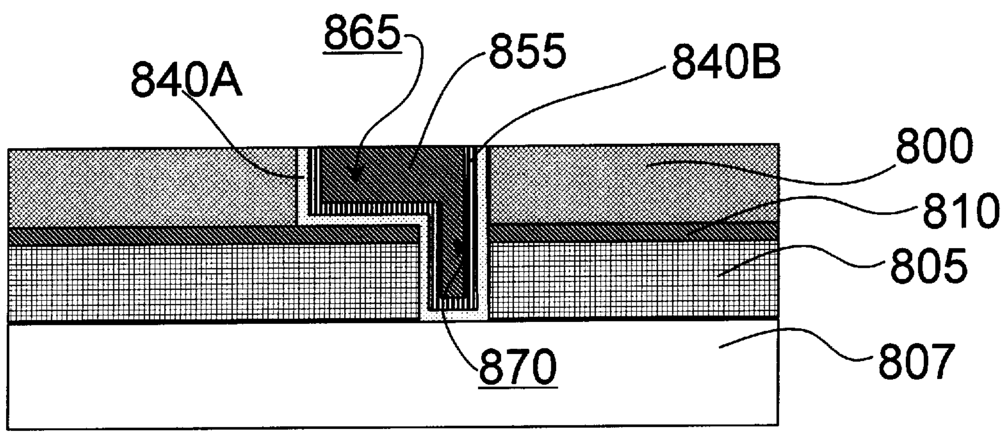

This process produces a copper opening-fill 855 only in the openings (such as openings 830 and 835), as shown in FIG. 8F. Once a sufficient opening-fill of copper 855 has been deposited, the surface of the wafer may be planarized using CMP techniques. Ideally, this removes all excess copper opening-fill 855 in the openings (such as opening 830) as well as the insulated conductive metallization layer of aluminum 815 (insulated by the thin dielectric layer of $SiO_2$ 820) from the entire upper surface 860 of the first dielectric layer 800. Copper is then left only in the copper-filled openings (such as copper-filled openings 865 and 870), as shown in FIG. 8G.

The dual-damascene copper process flow, as shown in FIGS. 8A–8G, combines the intermetal via connection formation with the copper opening-fill deposition by etching a more complex pattern before the barrier metal layer and copper seed layer depositions and before the copper opening-fill. The opening etching continues until the via hole (such as opening 835 in FIG. 8C) has been etched out. The rest of the dual-damascene copper process flow, as shown in FIGS. 8D–8G, is essentially identical with the corresponding single-damascene copper process flow, as shown in FIGS. 7D–7G. Overall, however, the dual-damascene copper process flow significantly reduces the number of processing steps and is a preferred method of achieving copper metallization.

Figure 9A:
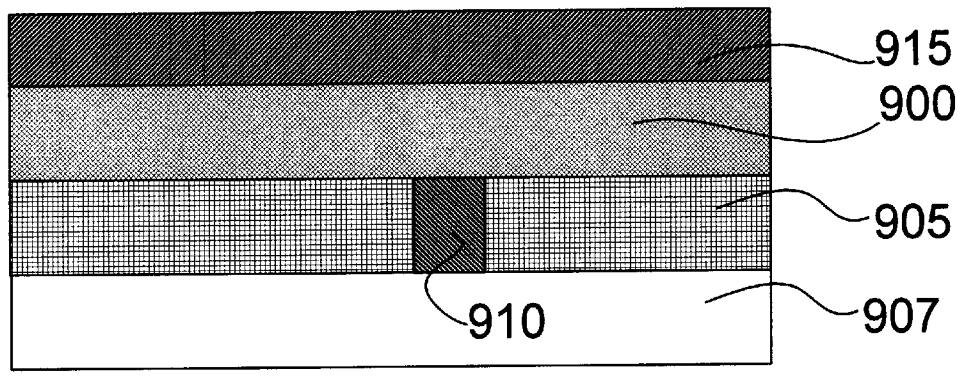
FIGS. 9A–9G show a selective copper electrodeposition process flow according to a sixth embodiment of the present invention.

Another single-damascene copper process flow, in a sixth embodiment of a method for selectively electrochemically depositing copper according to the present invention, is illustrated in FIGS. 9A–9G. As shown in FIG. 9A, a first dielectric layer 900 is formed (for example, by being deposited) on a second dielectric layer 905 on a structure layer 907. The structure layer 907 may be an underlayer of semiconducting material, such as a silicon substrate or wafer, for example, or, alternatively, may be an underlayer of semiconductor devices, such as a layer of metal oxide semiconductor field effect transistors (MOSFETs), and the like, and/or a metal interconnection layer or layers and/or an interlayer dielectric layer or layers, and the like. The first dielectric layer 900 may be an interlayer dielectric (ILD). The second dielectric layer 905 has an intermetal via connection 910 disposed therein. If necessary, the first dielectric layer 900 is planarized using chemical-mechanical planarization (CMP). A conductive polysilicon layer (either doped, and more conductive, or undoped, and less conductive) 915 is formed (for example, by being deposited) on the first dielectric layer 900 before the patterning of the openings. The conductive polysilicon layer 915 may be sputter-deposited or deposited using PVD.

Figure 9B:
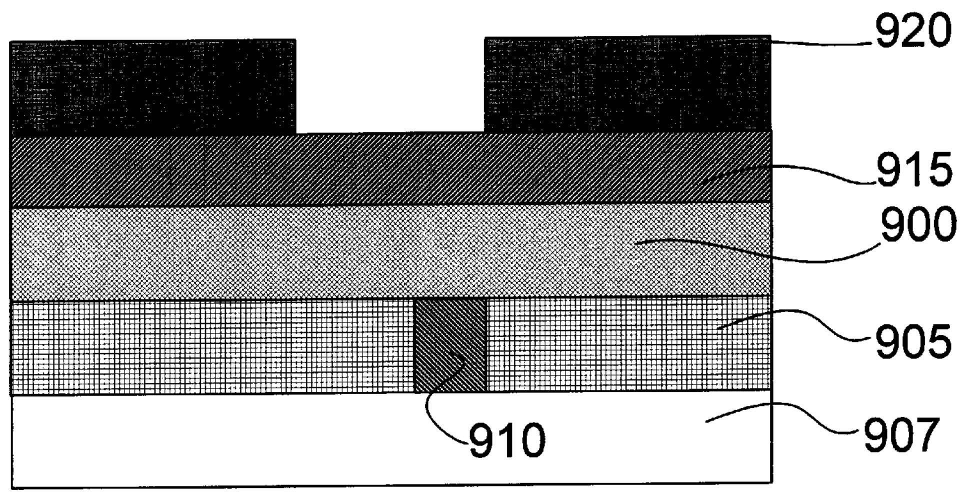
Figure 9C:
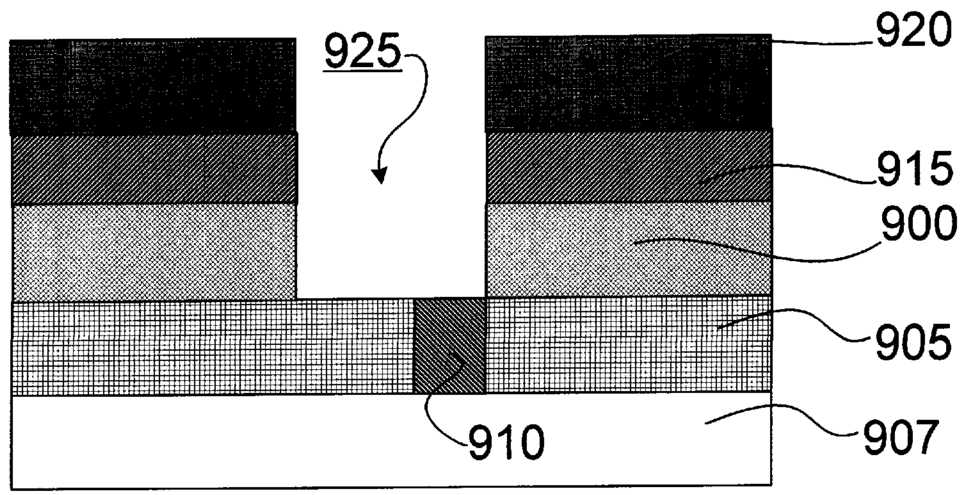

As shown in FIG. 9B, a metallization pattern is then applied using a patterned photomask 920 and photolithography. As shown in FIG. 9C, openings (such as opening 925) for conductive metal lines, contact holes, via holes, and the like, are etched, in a multi-step process, through the conductive polysilicon layer 915 and into the first dielectric layer 900. The patterned photomask 920 is then removed at this point.

Figure 9D:
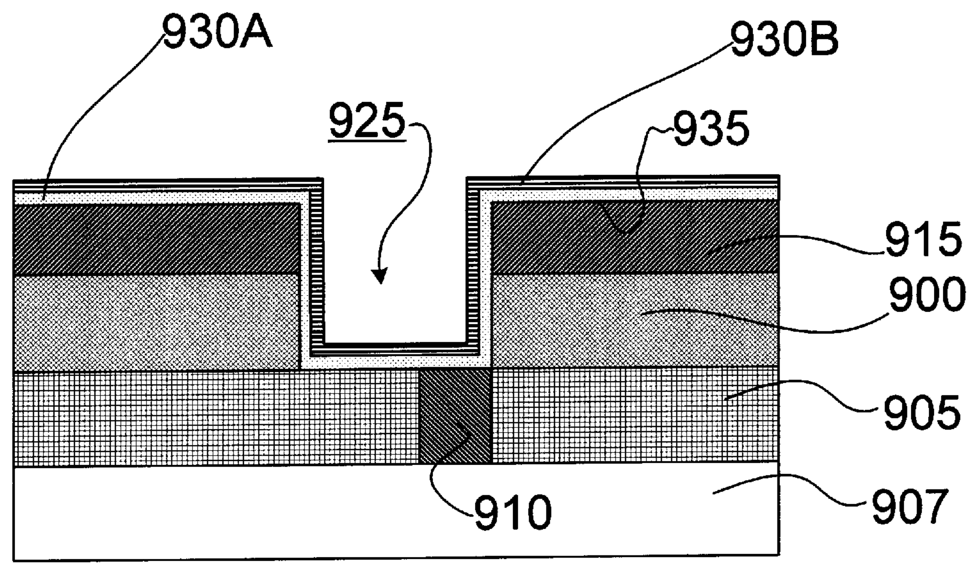

As shown in FIG. 9D, a thin barrier metal layer of tantalum 930A and a copper seed layer 930B are then applied to the entire surface using vapor-phase deposition. The barrier metal layer 930A may equivalently be formed of titanium nitride, titanium-tungsten, tantalum nitride, nitrided titanium-tungsten, magnesium, or another suitable barrier material. The tantalum barrier metal layer 930A and the copper seed layer 930B blanket-deposit the entire upper surface 935 of the conductive polysilicon layer 915 as well as the side and bottom surfaces of the opening 925.

Figure 9E:
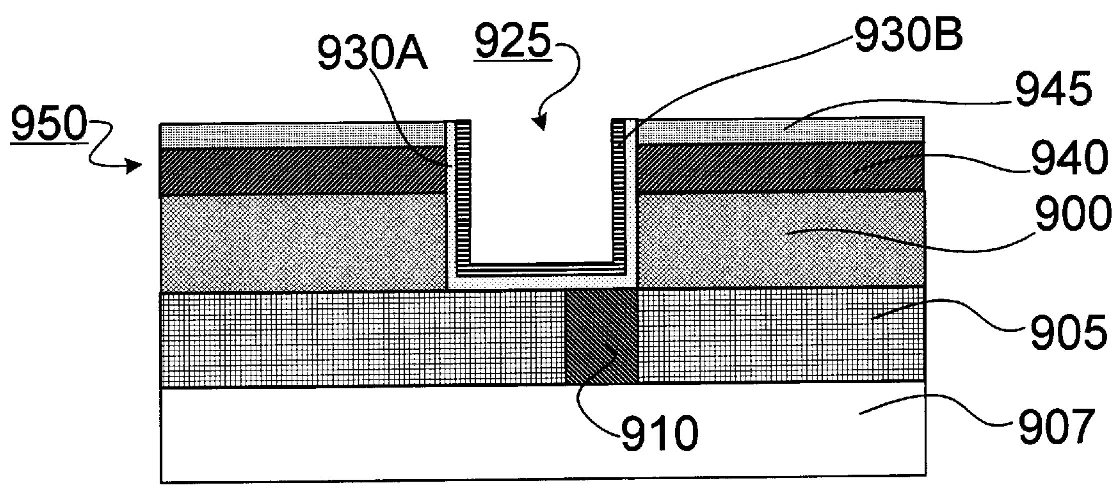

The conductive polysilicon layer 915 is then made conductive (or more conductive) by being converted into a silicided layer 940 along with overlying and adjacent portions of the tantalum barrier metal layer 930A and the copper seed layer 930B. For example, a rapid thermal anneal (RTA), or other suitable equivalent techniques, may be used to form the silicided layer 940, depending on the thermodynamics of the barrier metal layer and the copper seed layer materials chosen. This results in the chemical conversion into a silicide of at least the portions of the tantalum barrier metal layer 930A and the copper seed layer 930B that overlay the entire upper surface 935 of the conductive polysilicon layer 915, as shown in FIG. 9E.

A chemical reaction may also be used to selectively form an insulating layer 945 on top of the silicided layer 940 on an upper surface thereof. For example, the silicided layer 940 may be exposed to an oxygen or nitrogen plasma, either during or after the silicidization reaction. The insulating layer 945 may be silicon dioxide ($SiO_2$) formed by the surface oxidation of a silicon-rich silicided layer 940. The insulating layer 945 may equivalently be formed of silicon nitride (SiN), silicon oxynitride, metal oxide (such as MgO if magnesium is chosen as the barrier metal), or some suitable combination of these materials.

The insulated silicided layer 940 (insulated by the insulating layer 945) now provides a conductive path 950 conductively coupling and connecting the tantalum barrier metal layer 930A and the copper seed layer 930B in the openings (such as opening 925) across the entire wafer on which the structure layer 907 is disposed. The insulating layer 945 prevents electrochemical deposition in unwanted areas.

The bulk of the copper opening-fill may be done using an electroplating technique, where the conductive path 950 is mechanically clamped (or the insulating layer 945 may be selectively stripped at the wafer edge) to establish an electrical contact. The wafer is then immersed in an electrolyte solution containing copper ions (not shown). An electrical current is then passed through the wafer-electrolyte system to cause reduction and deposition of copper only on the copper seed layer 930B in the openings (such as opening 925).

Figure 9F:
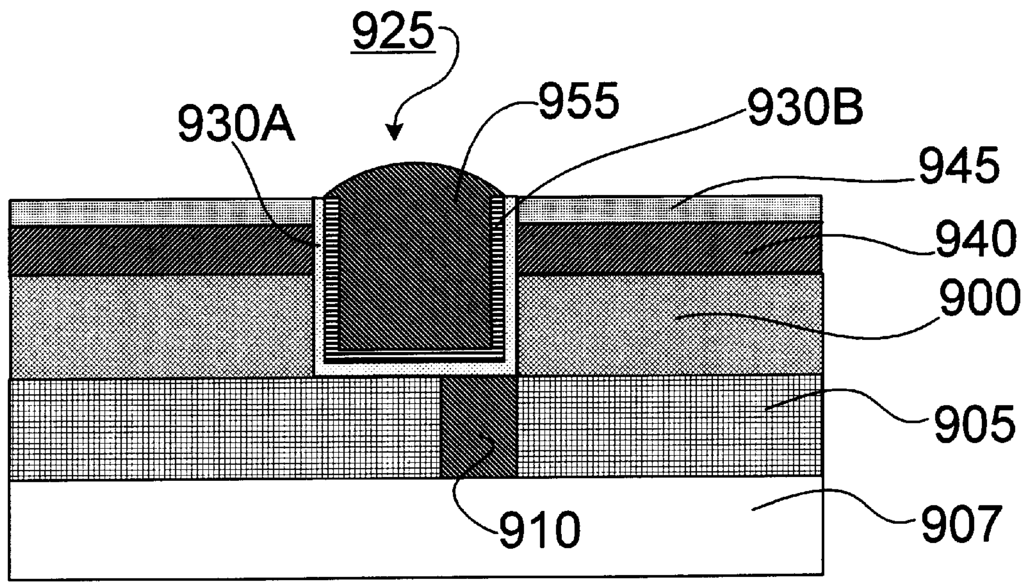
Figure 9G:
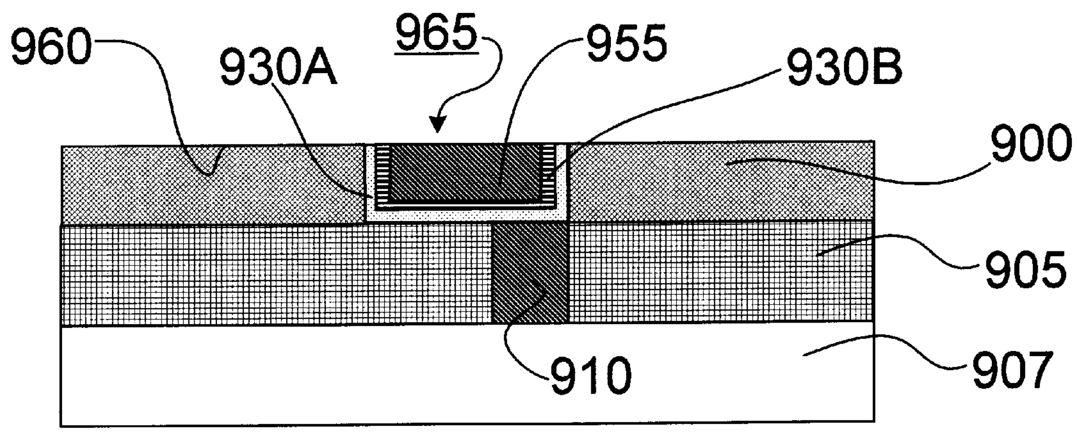

This process produces a copper opening-fill 955 only in the openings (such as opening 925), as shown in FIG. 9F. Once a sufficient opening-fill of copper 955 has been deposited, the surface of the wafer may be planarized using CMP techniques. Ideally, this removes all excess copper opening-fill 955 in the openings (such as opening 925) as well as the insulated silicided layer 940 (insulated by the insulating layer 945) from the entire upper surface 960 of the first dielectric layer 900. Copper is then left only in the copper-filled openings (such as copper-filled opening 965), as shown in FIG. 9G.

Figure 10A:
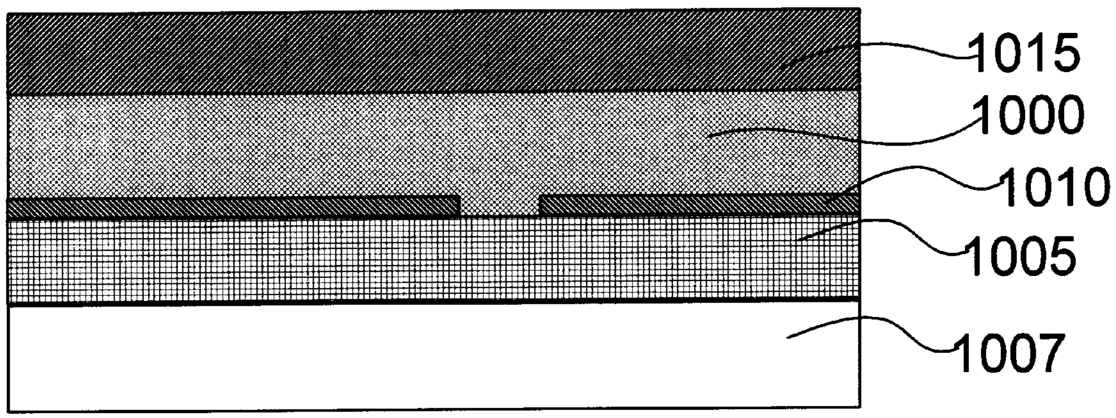
FIGS. 10A–10G show a selective copper electrodeposition process flow according to a seventh embodiment of the present invention.

A dual-damascene copper process flow, in a seventh embodiment of a method for selectively electrochemically depositing copper according to the present invention, is illustrated in FIGS. 10A–10G. As shown in FIG. 10A, a first dielectric layer 1000 is formed (for example, by being deposited) on a second dielectric layer 1005 on a structure layer 1007. The structure layer 1007 may be an underlayer of semiconducting material, such as a silicon substrate or wafer, for example, or, alternatively, may be an underlayer of semiconductor devices, such as a layer of metal oxide semiconductor field effect transistors (MOSFETs), and the like, and/or a metal interconnection layer or layers and/or an interlayer dielectric layer or layers, and the like. The first dielectric layer 1000 may be an interlayer dielectric (ILD). The second dielectric layer 1005 has a "hard mask" of silicon nitride (SiN) 1010 formed (for example, by being deposited and patterned) thereon, between the first dielectric layer 1000 and the second dielectric layer 1005. If necessary, the first dielectric layer 1000 is planarized using chemical-mechanical planarization (CMP). A conductive polysilicon layer (either doped, and more conductive, or undoped, and less conductive) 1015 is formed (for example, by being deposited) on the first dielectric layer 1000 before the patterning of the openings. The conductive polysilicon layer 1015 may be sputter-deposited or deposited using PVD.

Figure 10B:
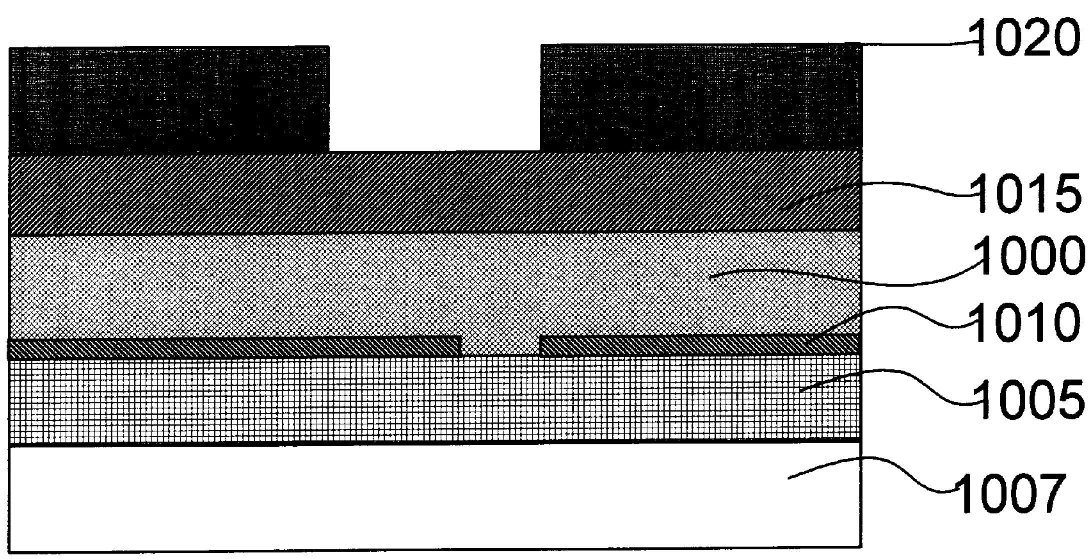
Figure 10C:
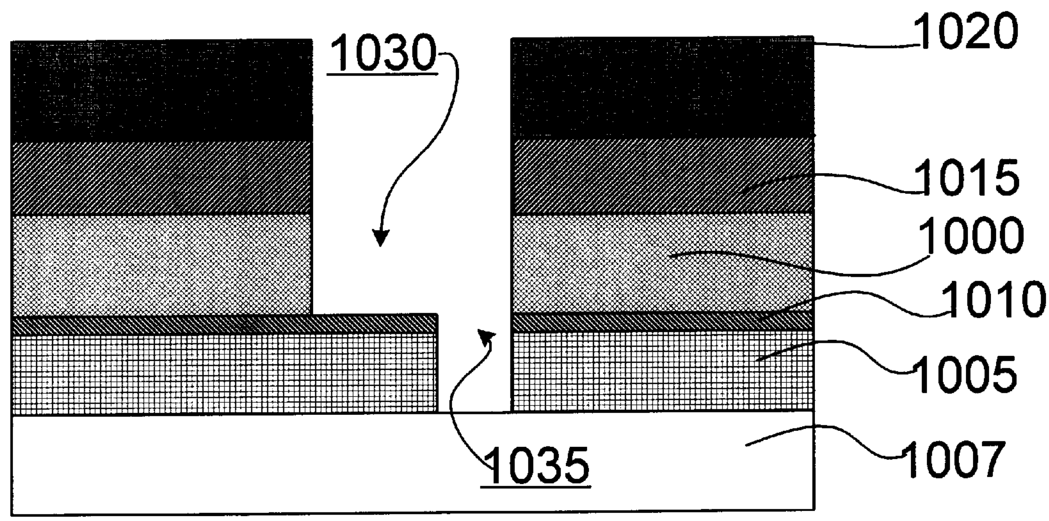

As shown in FIG. 10B, a metallization pattern is then applied using a patterned photomask 1020 and photolithography. As shown in FIG. 10C, openings (such as openings 1030 and 1035) for conductive metal lines, contact holes, via holes, and the like, are etched, in a multi-step process, through the conductive polysilicon layer 1015 and the first dielectric layer 1000 and into the second dielectric layer 1005. The patterned hard mask of SiN 1010 determines the amount of etching of the second dielectric layer 1005. The patterned photomask 1020 is then removed at this point.

Figure 10D:
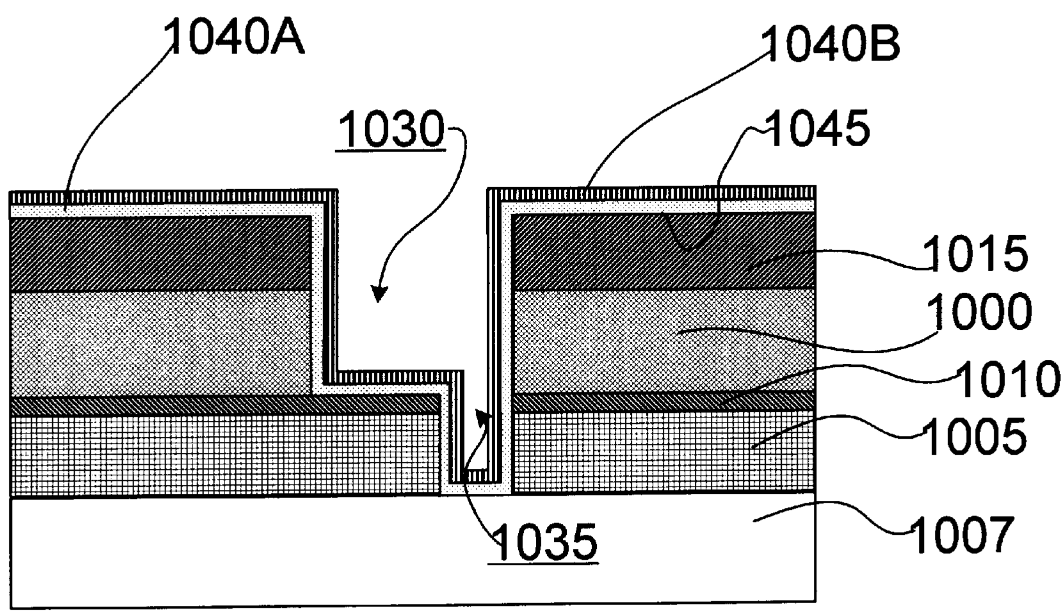

As shown in FIG. 10D, a thin barrier metal layer of tantalum 1040A and a copper seed layer 1040B are then applied to the entire surface using vapor-phase deposition. The barrier metal layer 1040A may equivalently be formed of titanium nitride, titanium-tungsten, tantalum nitride, nitrided titanium-tungsten, magnesium, or another suitable barrier material. The tantalum barrier metal layer 1040A and the copper seed layer 1040B blanket-deposit the entire upper surface 1045 of the conductive polysilicon layer 1015 as well as the side and bottom surfaces of the openings 1030 and 1035.

Figure 10E:
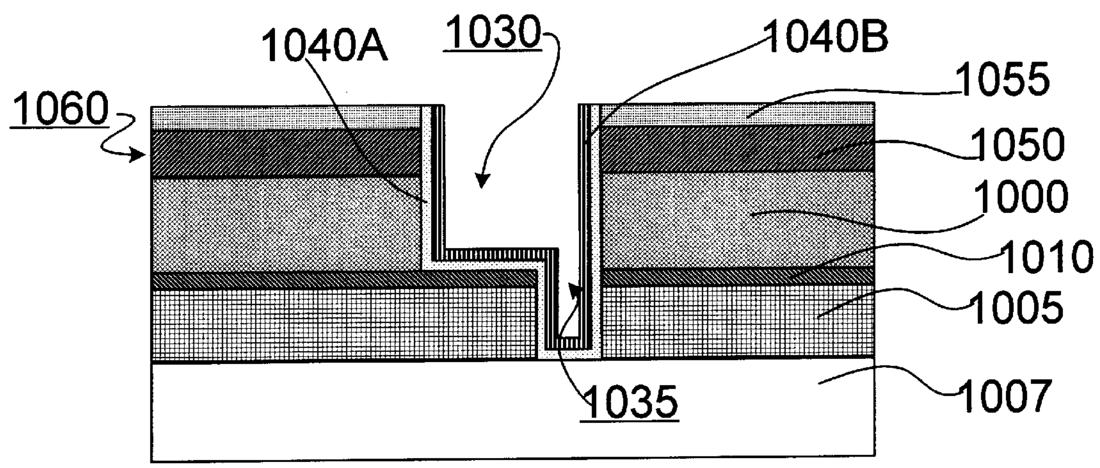

The conductive polysilicon layer 1015 is then made conductive (or more conductive) by being converted into a silicided layer 1050 along with overlying and adjacent portions of the tantalum barrier metal layer 1040A and the copper seed layer 1040B. For example, a rapid thermal anneal (RTA), or other suitable equivalent techniques, may be used to form the silicided layer 1050, depending on the thermodynamics of the barrier metal layer and the copper seed layer materials chosen. This results in the chemical conversion into a silicide of at least the portions of the tantalum barrier metal layer 1040A and the copper seed layer 1040B that overlay the entire upper surface 1045 of the conductive polysilicon layer 1015, as shown in FIG. 10E.

A chemical reaction may also be used to selectively form an insulating layer 1055 on top of the silicided layer 1050 on an upper surface thereof. For example, the silicided layer 1050 may be exposed to an oxygen or nitrogen plasma, either during or after the silicidization reaction. The insulating layer 1055 may be silicon dioxide ($SiO_2$) formed by the surface oxidation of a silicon-rich silicided layer 1050. The insulating layer 1055 may equivalently be formed of silicon nitride (SiN), silicon oxynitride, metal oxide (such as MgO if magnesium is chosen as the barrier metal), or some suitable combination of these materials.

The insulated silicided layer 1050 (insulated by the insulating layer 1055) now provides a conductive path 1060 conductively coupling and connecting the tantalum barrier metal layer 1040A with the copper seed layer 1040B in the openings (such as openings 1030 and 1035) across the entire wafer on which the structure layer 1007 is disposed. The insulating layer 1055 prevents electrochemical deposition in unwanted areas.

The bulk of the copper opening-fill may be done using an electroplating technique, where the conductive path 1060 is mechanically clamped (or the insulating layer 1055 may be selectively stripped at the wafer edge) to establish an electrical contact. The wafer is then immersed in an electrolyte solution containing copper ions (not shown). An electrical current is then passed through the wafer-electrolyte system to cause reduction and deposition of copper only on the copper seed layer 1040B in the openings (such as openings 1030 and 1035).

Figure 10F:
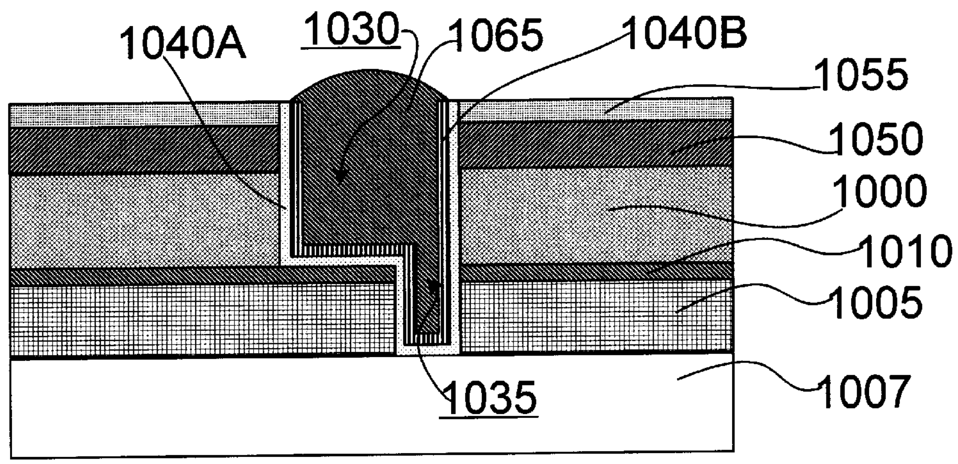
Figure 10G:
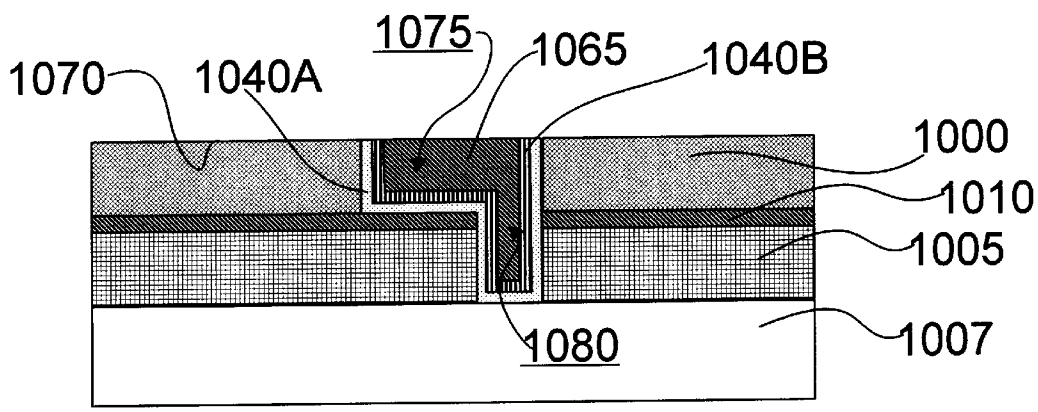

This process produces a copper opening-fill 1065 only in the openings (such as openings 1030 and 1035), as shown in FIG. 10F. Once a sufficient opening-fill of copper 1065 has been deposited, the surface of the wafer may be planarized using CMP techniques. Ideally, this removes all excess copper opening-fill 1065 in the openings (such as opening 1030) as well as the insulated silicided layer 1050 (insulated by the insulating layer 1055) from the entire upper surface 1070 of the first dielectric layer 1000. Copper is then left only in the copper-filled openings (such as copper-filled openings 1075 and 1080), as shown in FIG. 10G.

The dual-damascene copper process flow, as shown in FIGS. 10A–10G, combines the intermetal via connection formation with the copper opening-fill deposition by etching a more complex pattern before the barrier metal layer and copper seed layer depositions and before the copper opening-fill. The opening etching continues until the via hole (such as opening 1035 in FIG. 10C) has been etched out. The rest of the dual-damascene copper process flow, as shown in FIGS. 10D–10G, is essentially identical with the corresponding single-damascene copper process flow, as shown in FIGS. 9D–9G. Overall, however, the dual-damascene copper process flow significantly reduces the number of processing steps and is a preferred method of achieving copper metallization.

Any of the above-disclosed embodiments of a method for selectively electrochemically depositing copper according to the present invention enables a copper layer to be selectively deposited only to desired areas. This decreases the cost of the raw materials and the amount of processing needed to remove the copper from undesired areas when compared to conventional dual-damascene copper process flows, as shown in FIGS. 2A–2E, and conventional single-damascene copper process flows, as shown in FIGS. 1A–1E. These conventional processes entail electroplating a copper layer across the entire conductive surface. By contrast, selective copper deposition methods, as in the above-disclosed embodiments of a method for selectively electrochemically depositing copper according to the present invention, lower manufacturing costs. Manufacturing costs are lowered by increasing throughput, reducing consumption of electroplating solution and CMP consumables, reducing the amount of post-metallization-deposition CMP needed and reducing the amount of hazardous effluents at both the copper deposition and CMP steps.

Further, conventional selective copper deposition methods, as shown in FIGS. 3A–3E, face the problems of being limited by the conductive properties of barrier layer 320 and of having the difficulty of removing the dielectric material mask 325 from contact openings 310. These problems arise because the barrier layer 320 is used as a conductive coupling between contact openings 310, and because the dielectric material mask 325 is formed after contact openings 310 have been etched. These problems tend to increase the complexity and costs of the manufacturing process and decrease throughput.

By contrast, in any of the above-disclosed embodiments of a method for selectively electrochemically depositing copper according to the present invention, because the barrier metal and copper seed layers selectively formed only in the openings are conductively coupled to a conductive layer, the conductive properties of the barrier metal and copper seed layers between the openings are not limiting. Furthermore, in any of the above-disclosed embodiments of a method for selectively electrochemically depositing copper according to the present invention, there is no formation or deposition of a photoresist or masking material after openings have been formed or etched. Finally, in any of the above-disclosed embodiments of a method for selectively electrochemically depositing copper according to the present invention, it is not necessary to etch the barrier or seed layers, which can be extremely difficult and time consuming. These differences contribute to decreasing the complexity and costs of the manufacturing process and increasing throughput.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for selectively electrochemically depositing copper, the method comprising:

forming a layer of dielectric material above a structure layer;

forming a conductive layer above the layer of dielectric material;

forming an opening in the conductive layer and the layer of dielectric material;

selectively forming at least one barrier metal layer and a copper seed layer only in the opening, the at least one barrier metal layer and the copper seed layer being conductively coupled to the conductive layer;

forming an insulating layer above the conductive layer; and selectively electrochemically depositing copper only in the opening.

2. The method of claim 1, wherein selectively forming the at least one barrier metal layer and the copper seed layer only in the opening comprises:

forming a masking layer on the conductive layer above the insulating layer, wherein the at least one barrier metal layer and the copper seed layer are formed in the opening and above the masking layer; and removing the masking layer and removing portions of the at least one barrier metal layer and the copper seed layer overlying the masking layer, wherein the structure layer comprises one of a semiconducting substrate, an underlayer of semiconductor devices, a conductive interconnection layer and an interlayer dielectric layer.

3. The method of claim 1, wherein selectively forming the at least one barrier metal layer and the copper seed layer only in the opening comprises:

forming the at least one barrier metal layer and the copper seed layer in the opening and above the conductive layer;

converting portions of the conductive layer along with adjacent portions of the at least one barrier metal layer and the copper seed layer into a silicide; and forming the insulating layer above the silicide, wherein the structure layer comprises one of a semiconducting substrate, an underlayer of semiconductor devices, a conductive interconnection layer and an interlayer dielectric layer.

4. The method of claim 1, further comprising:

forming a masking layer on the conductive layer before the formation of the opening;

forming the opening by etching the conductive layer and the layer of dielectric material;

removing the masking layer after the formation of the opening; and removing the insulating layer and the conductive layer, wherein the structure layer comprises one of a semiconducting substrate, an underlayer of semiconductor devices, a conductive interconnection layer and an interlayer dielectric layer.

5. The method of claim 4, wherein the insulating layer is formed before the masking layer is formed, forming the opening further comprises etching the insulating layer, and the at least one barrier metal layer and the copper seed layer are deposited above the masking layer before the at least one barrier metal layer and the copper seed layer are selectively formed only in the opening.

6. The method of claim 5, wherein the conductive layer includes one of aluminum, tungsten, doped polysilicon and a conductive polymer.

7. The method of claim 6, wherein the conductive layer includes aluminum and the at least one barrier metal layer comprises one of tantalum, titanium nitride, titanium-tungsten, nitrided titanium-tungsten, magnesium, and tantalum nitride.

8. The method of claim 5, wherein the insulating layer includes one of an oxide, a nitride, spin-on-glass and an insulating polymer.

9. The method of claim 8, wherein the insulating layer includes silicon dioxide.

10. The method of claim 5, wherein the removal of the masking layer includes removing portions of the at least one barrier metal layer and the copper seed layer overlying the masking layer.

11. The method of claim 4, wherein the insulating layer is formed after the masking layer is removed and the at least one barrier metal layer and the copper seed layer are deposited above the conductive layer after the masking layer is removed.

12. The method of claim 11, wherein the conductive layer includes one of doped polysilicon and undoped polysilicon.

13. The method of claim 12, wherein the conductive layer is deposited by physical vapor deposition on the dielectric layer and the at least one barrier metal layer includes one of tantalum, titanium nitride, titanium-tungsten, nitrided titanium-tungsten, magnesium, and tantalum nitride.

14. The method of claim 12, wherein portions of the conductive layer along with overlying portions of the at least one barrier metal layer and the copper seed layer are subjected to a silicidization process forming a silicide.

15. The method of claim 14, wherein the portions of the conductive layer and the overlying portions of the at least one barrier metal layer and the copper seed layer are silicidized by a rapid thermal anneal.

16. The method of claim 11, wherein the insulating layer includes at least one of silicon oxide, silicon nitride, silicon oxynitride and metal oxide.

17. The method of claim 14, wherein the insulating layer is formed by exposure to one of an oxygen plasma and a nitrogen plasma during the silicidization process.

18. The method of claim 14, wherein the insulating layer is formed by exposure to one of an oxygen plasma and a nitrogen plasma after the silicidization process.

19. The method of claim 14, wherein the insulating layer includes silicon dioxide formed by surface oxidation of the silicide.

20. The method of claim 14, wherein the insulating layer includes magnesium oxide and the at least one barrier metal layer includes magnesium.

21. A method for selectively electrochemically depositing copper, the method comprising:

forming a layer of dielectric material above a structure layer;

forming a conductive layer above the layer of dielectric material;

forming a masking layer above the conductive layer;

etching the conductive layer and the layer of dielectric material to form an opening;

forming a barrier metal layer and a copper seed layer in the opening, the barrier metal and copper seed layers being conductively coupled to the conductive layer; forming an insulating layer above the conductive layer;

removing the masking layer; and selectively electrochemically depositing copper only in the opening.

22. The method of claim 21, further comprising:

removing the insulating layer and the conductive layer, wherein the structure layer comprises one of a semiconducting substrate, an underlayer of semiconductor devices, a conductive interconnection layer and an interlayer dielectric layer.

23. The method of claim 21, wherein the insulating layer is formed before the masking layer is formed, the etching of the conductive layer and the dielectric layer also includes etching of the insulating layer, and the barrier metal and copper seed layers are blanket-deposited using vapor-phase deposition before the masking layer is removed.

24. The method of claim 23, wherein the conductive layer includes one of aluminum, tungsten, doped polysilicon and a conductive polymer.

25. The method of claim 24, wherein the conductive layer includes aluminum and the barrier metal layer includes one of tantalum, titanium nitride, titanium-tungsten, nitrided titanium-tungsten, magnesium, and tantalum nitride.

26. The method of claim 23, wherein the insulating layer includes one of an oxide, a nitride, spin-on-glass and an insulating polymer.

27. The method of claim 26, wherein the insulating layer includes silicon dioxide.

28. The method of claim 23, wherein the removal of the masking layer includes removing portions of the barrier metal and copper seed layers overlying the masking layer.

29. The method of claim 21, wherein the insulating layer is formed after the masking layer is removed and the barrier metal and copper seed layers are blanket-deposited using vapor-phase deposition after the masking layer is removed.

30. The method of claim 29, wherein the conductive layer includes one of doped polysilicon and undoped polysilicon.

31. The method of claim 30, wherein the conductive layer is deposited by physical vapor deposition on the dielectric layer and the barrier metal layer includes one of tantalum, titanium nitride, titanium-tungsten, nitrided titanium-tungsten, magnesium, and tantalum nitride.

32. The method of claim 30, wherein portions of the conductive layer along with overlying portions of the barrier metal and copper seed layers are subjected to a silicidization process forming a silicide.

33. The method of claim 32, wherein the portions of the conductive layer and the overlying portions of the barrier metal and copper seed layers are silicidized by a rapid thermal anneal.

34. The method of claim 29, wherein the insulating layer includes at least one of silicon oxide, silicon nitride, silicon oxynitride and metal oxide.

35. The method of claim 32, wherein the insulating layer is formed by exposure to one of an oxygen plasma and a nitrogen plasma during the silicidization process.

36. The method of claim 32, wherein the insulating layer is formed by exposure to one of an oxygen plasma and a nitrogen plasma after the silicidization process.

37. The method of claim 32, wherein the insulating layer includes silicon dioxide formed by surface oxidation of the silicide.

38. The method of claim 32, wherein the insulating layer includes magnesium oxide and the barrier metal layer includes magnesium.

39. The method of claim 21, wherein forming the barrier metal layer and the copper seed layer in the opening comprises:

forming the masking layer above the insulating layer, wherein the barrier metal layer and the copper seed layer are formed in the opening and above the masking layer; and removing the masking layer so that portions of the barrier metal layer and the copper seed layer overlying the masking layer are removed, wherein the structure layer comprises one of a semiconducting substrate, an underlayer of semiconductor devices, a conductive interconnection layer and an interlayer dielectric layer.

40. The method of claim 21, wherein forming the barrier metal layer and the copper seed layer in the opening comprises:

forming the barrier metal layer and the copper seed layer in the opening and above the conductive layer;

converting portions of the conductive layer along with adjacent portions of the barrier metal layer and the copper seed layer into a silicide; and forming the insulating layer above the silicide, wherein the structure layer comprises one of a semiconducting substrate, an underlayer of semiconductor devices, a conductive interconnection layer and an interlayer dielectric layer.

41. A method for selectively electrochemically depositing copper, the method comprising:

forming a first layer of dielectric material above a structure layer;

forming a first masking layer above the first layer of dielectric material;

forming a second layer of dielectric material above the first masking layer and the first layer of dielectric material;

forming a conductive layer above the second layer of dielectric material;

forming a second masking layer above the conductive layer;

etching the conductive layer and the second layer of dielectric material to form a first opening and etching the first layer of dielectric material to form a second opening;

forming a barrier metal layer and a copper seed layer in the first and second openings, the barrier metal and copper seed layers being conductively coupled to the conductive layer;

forming an insulating layer above the conductive layer;

removing the second masking layer; and selectively electrochemically depositing copper only in the first and second openings.

42. The method of claim 41, including:

removing the insulating layer and the conductive layer, wherein the structure layer comprises one of a semiconducting substrate, an underlayer of semiconductor devices, a conductive interconnection layer and an interlayer dielectric layer.

43. The method of claim 41, wherein the insulating layer is formed before the second masking layer is formed, the etching of the conductive layer and the second dielectric layer also includes etching of the insulating layer, and the barrier metal and copper seed layers are blanket-deposited using vapor-phase deposition before the second masking layer is removed.

44. The method of claim 43, wherein the conductive layer includes one of aluminum, tungsten, doped polysilicon and a conductive polymer.

45. The method of claim 44, wherein the conductive layer includes aluminum and the barrier metal layer includes one of tantalum, titanium nitride, titanium-tungsten, nitrided titanium-tungsten, magnesium, and tantalum nitride.

46. The method of claim 43, wherein the insulating layer includes one of an oxide, a nitride, spin-on-glass and an insulating polymer.

47. The method of claim 46, wherein the insulating layer includes silicon dioxide.

48. The method of claim 43, wherein the removal of the second masking layer includes removing portions of the barrier metal and copper seed layers overlying the second masking layer.

49. The method of claim 41, wherein the insulating layer is formed after the second masking layer is removed and the barrier metal and copper seed layers are blanket-deposited using vapor-phase deposition after the second masking layer is removed.

50. The method of claim 49, wherein the conductive layer includes one of doped polysilicon and undoped polysilicon.

51. The method of claim 50, wherein the conductive layer is deposited by physical vapor deposition on the dielectric layer and the barrier metal layer includes one of tantalum, titanium nitride, titanium-tungsten, nitrided titanium-tungsten, magnesium, and tantalum nitride.

52. The method of claim 50, wherein portions of the conductive layer along with overlying portions of the barrier metal and copper seed layers are subjected to a silicidization process forming a silicide.

53. The method of claim 52, wherein the portions of the conductive layer and the overlying portions of the barrier metal and copper seed layers are silicidized by a rapid thermal anneal.

54. The method of claim 49, wherein the insulating layer includes at least one of silicon oxide, silicon nitride, silicon oxynitride and metal oxide.

55. The method of claim 52, wherein the insulating layer is formed by exposure to one of an oxygen plasma and a nitrogen plasma during the silicidization process.

56. The method of claim 52, wherein the insulating layer is formed by exposure to one of an oxygen plasma and a nitrogen plasma after the silicidization process.

57. The method of claim 52, wherein the insulating layer includes silicon dioxide formed by surface oxidation of the silicide.

58. The method of claim 52, wherein the insulating layer includes magnesium oxide and the barrier metal layer includes magnesium.

59. The method of claim 41, wherein forming the barrier metal layer and the copper seed layer in the first and second openings comprises:

forming the second masking layer above the insulating layer, wherein the barrier metal layer and the copper seed layer are formed in the first and second openings and above the second masking layer; and removing the second masking layer so that portions of the barrier metal layer and the copper seed layer overlying the second masking layer are removed, wherein the structure layer comprises one of a semiconducting substrate, an underlayer of semiconductor devices, a conductive interconnection layer and an interlayer dielectric layer.

60. The method of claim 41, wherein forming the barrier metal layer and the copper seed layer in the first and second openings comprises:

forming the barrier metal layer and the copper seed layer in the first and second openings and above the conductive layer;

converting portions of the conductive layer along with adjacent portions of the barrier metal layer and the copper seed layer into a silicide; and forming the insulating layer above the silicide, wherein the structure layer comprises one of a semiconducting substrate, an underlayer of semiconductor devices, a conductive interconnection layer and an interlayer dielectric layer.

61. A method for selectively electrochemically depositing copper, the method comprising:

forming a layer of dielectric material above a structure layer;

forming a conductive layer above the layer of dielectric material;

forming an insulating layer above the conductive layer;

forming a masking layer above the insulating layer and patterning the masking layer;

forming an opening in the insulating layer, the conductive layer and the layer of dielectric material using the patterned masking layer;

forming at least one barrier metal layer and a copper seed layer in the opening and above the masking layer, the at least one barrier metal layer and the copper seed layer being conductively coupled to the conductive layer;

removing the masking layer and portions of the at least one barrier metal layer and the copper seed layer above the masking layer; and selectively electrochemically depositing copper only in the opening.

62. The method of claim 61, wherein the conductive layer includes one of aluminum, tungsten, doped polysilicon and a conductive polymer.

63. The method of claim 62, wherein the conductive layer includes aluminum and the at least one barrier metal layer comprises one of tantalum, titanium nitride, titanium-tungsten, nitrided titanium-tungsten, magnesium, and tantalum nitride.

64. The method of claim 61, wherein the insulating layer includes one of an oxide, a nitride, spin-on-glass and an insulating polymer.

65. The method of claim 64, wherein the insulating layer includes silicon dioxide.

66. A method for selectively electrochemically depositing copper, the method comprising:

forming a layer of dielectric material above a structure layer;

forming a conductive layer above the layer of dielectric material;

forming a masking layer above the conductive layer and patterning the masking layer;

forming an opening in the conductive layer and the layer of dielectric material using the patterned masking layer;

removing the masking layer;

forming at least one barrier metal layer and a copper seed layer in the opening and above the conductive layer;

converting portions of the conductive layer along with adjacent portions of the at least one barrier metal layer and the copper seed layer into a silicide;

forming an insulating layer above the silicide, the at least one barrier metal layer and the copper seed layer in the opening being conductively coupled to the conductive layer; and selectively electrochemically depositing copper only in the opening.

67. The method of claim 66, wherein the conductive layer includes one of doped polysilicon and undoped polysilicon.

68. The method of claim 67, wherein the conductive layer is deposited by physical vapor deposition on the dielectric layer and the at least one barrier metal layer includes one of tantalum, titanium nitride, titanium-tungsten, nitrided titanium-tungsten, magnesium, and tantalum nitride.

69. The method of claim 66, wherein the portions of the conductive layer and the overlying portions of the at least one barrier metal layer and the copper seed layer are silicidized by a rapid thermal anneal.

70. The method of claim 66, wherein the insulating layer includes at least one of silicon oxide, silicon nitride, silicon oxynitride and metal oxide.

71. The method of claim 66, wherein the insulating layer is formed by exposure to one of an oxygen plasma and a nitrogen plasma during the silicidization process.

72. The method of claim 66, wherein the insulating layer is formed by exposure to one of an oxygen plasma and a nitrogen plasma after the silicidization process.

73. The method of claim 66, wherein the insulating layer includes silicon dioxide formed by surface oxidation of the silicide.

74. The method of claim 66, wherein the insulating layer includes magnesium oxide and the at least one barrier metal layer includes magnesium.

* * * * *